United States Patent
Leipold et al.

(10) Patent No.: US 9,847,565 B2
(45) Date of Patent: Dec. 19, 2017

(54) TUNABLE SLOW-WAVE TRANSMISSION LINE

(71) Applicant: RF Micro Devices, Inc., Greensboro, NC (US)

(72) Inventors: Dirk Robert Walter Leipold, San Jose, CA (US); George Maxim, Saratoga, CA (US); Marcus Granger-Jones, Scotts Valley, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 122 days.

(21) Appl. No.: 14/930,937

(22) Filed: Nov. 3, 2015

(65) Prior Publication Data

US 2016/0126607 A1    May 5, 2016

Related U.S. Application Data

(63) Continuation-in-part of application No. 14/921,218, filed on Oct. 23, 2015.
(Continued)

(51) Int. Cl.
*H01P 9/00* (2006.01)
*H01P 1/203* (2006.01)
(Continued)

(52) U.S. Cl.
CPC .......... *H01P 1/20381* (2013.01); *H01P 5/028* (2013.01); *H01P 9/006* (2013.01); *H05K 1/00* (2013.01)

(58) Field of Classification Search
CPC ...... H01P 1/20381; H01P 5/028; H01P 9/006; H05K 1/00
(Continued)

(56) References Cited

U.S. PATENT DOCUMENTS 4,471,330 A * 9/1984 Naster .............. H01P 1/185
                                                  333/161
6,133,805 A   10/2000 Jain et al.
(Continued)

OTHER PUBLICATIONS

Jia, Xu et al., "The Miniaturization Design of Microstrip Interdigital Bandpass Filter," 2009 2nd International Conference on Power Electronics and Intelligent Transportation System (PEITS), vol. 3, Dec. 19-20, 2009, Shenzhen, CN, IEEE, pp. 74-76.
(Continued)

*Primary Examiner* — Stephen E Jones
*Assistant Examiner* — Scott S Outten
(74) *Attorney, Agent, or Firm* — Withrow & Terranova, P.L.L.C.

(57) ABSTRACT

The present disclosure relates to a tunable slow-wave transmission line. The tunable slow-wave transmission line is formed in a multi-layer substrate and includes an undulating signal path. The undulating signal path includes at least two loop structures, wherein each loop structure includes at least two via structures connected by at least one intra-loop trace. The undulating signal path further includes at least one inter-loop trace connecting the at least two loop structures. The tunable slow-wave transmission line includes a first ground structure disposed along the undulating signal path. Further, the tunable slow-wave transmission line includes one or more circuits that may alter a signal transmitted in the tunable slow-wave transmission line so as to tune a frequency of the signal.

16 Claims, 39 Drawing Sheets

Related U.S. Application Data

(60) Provisional application No. 62/074,457, filed on Nov. 3, 2014.

(51) Int. Cl.
*H01P 5/02* (2006.01)
*H05K 1/00* (2006.01)

(58) Field of Classification Search
USPC .......................................................... 333/161
See application file for complete search history.

(56) References Cited

U.S. PATENT DOCUMENTS

| | | |
|---|---|---|
| 2009/0236141 A1 | 9/2009 | Kim et al. |
| 2013/0207740 A1* | 8/2013 | Kato ...................... H01P 3/082 |
| | | 333/33 |
| 2015/0372361 A1 | 12/2015 | Abdellatif et al. |

OTHER PUBLICATIONS

Nath, Jayesh et al., "A Tunable Combline Bandpass Filter Using Barium Strontium Titanate Interdigital Varactors on an Alumina Substrate," 2005 IEEE MTT-S International Microwave Symposium Digest, IEEE, 2005, 4 pages.

Non-Final Office Action for U.S. Appl. No. 14/931,541, dated May 4, 2017, 19 pages.

Non-Final Office Action for U.S. Appl. No. 14/921,218, dated May 3, 2017, 17 pages.

\* cited by examiner

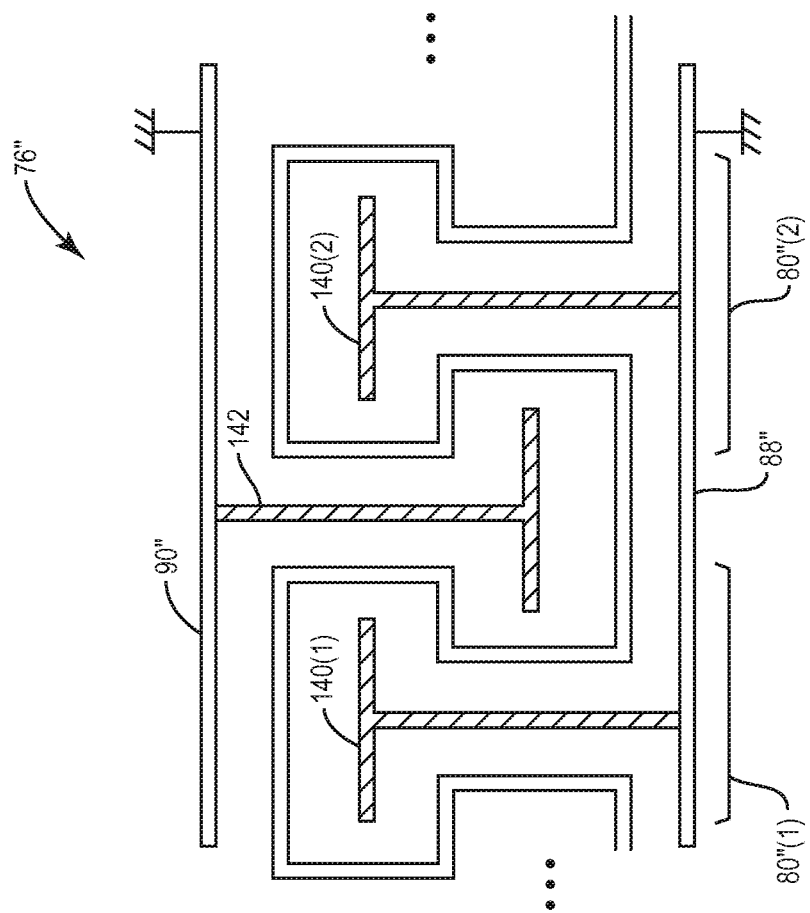

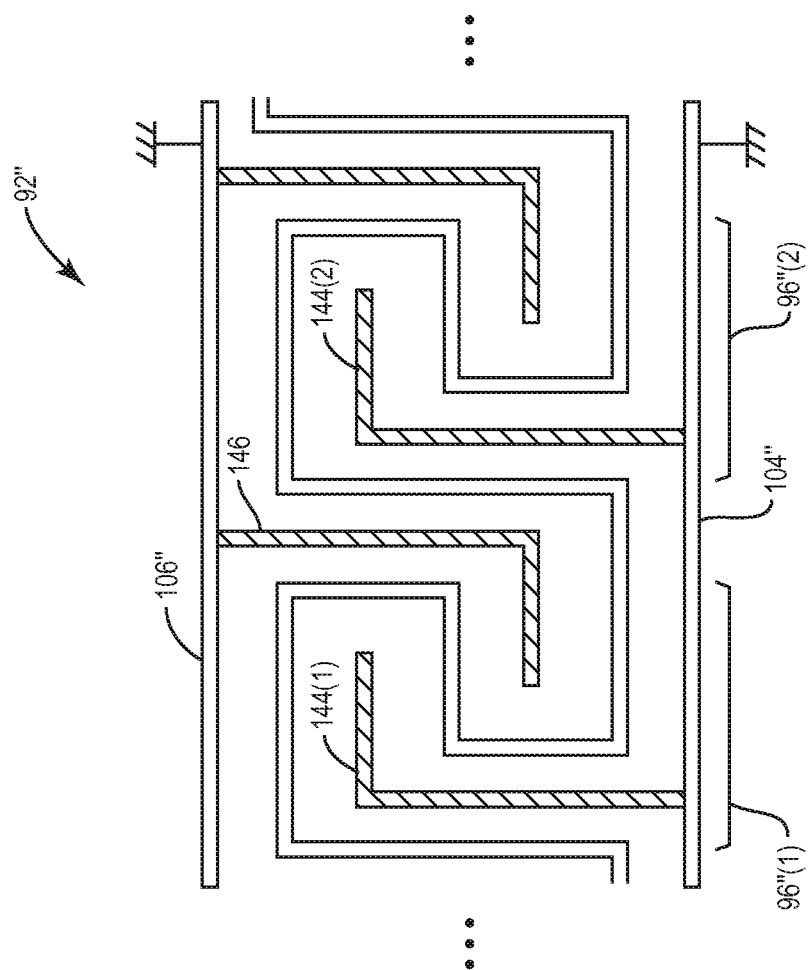

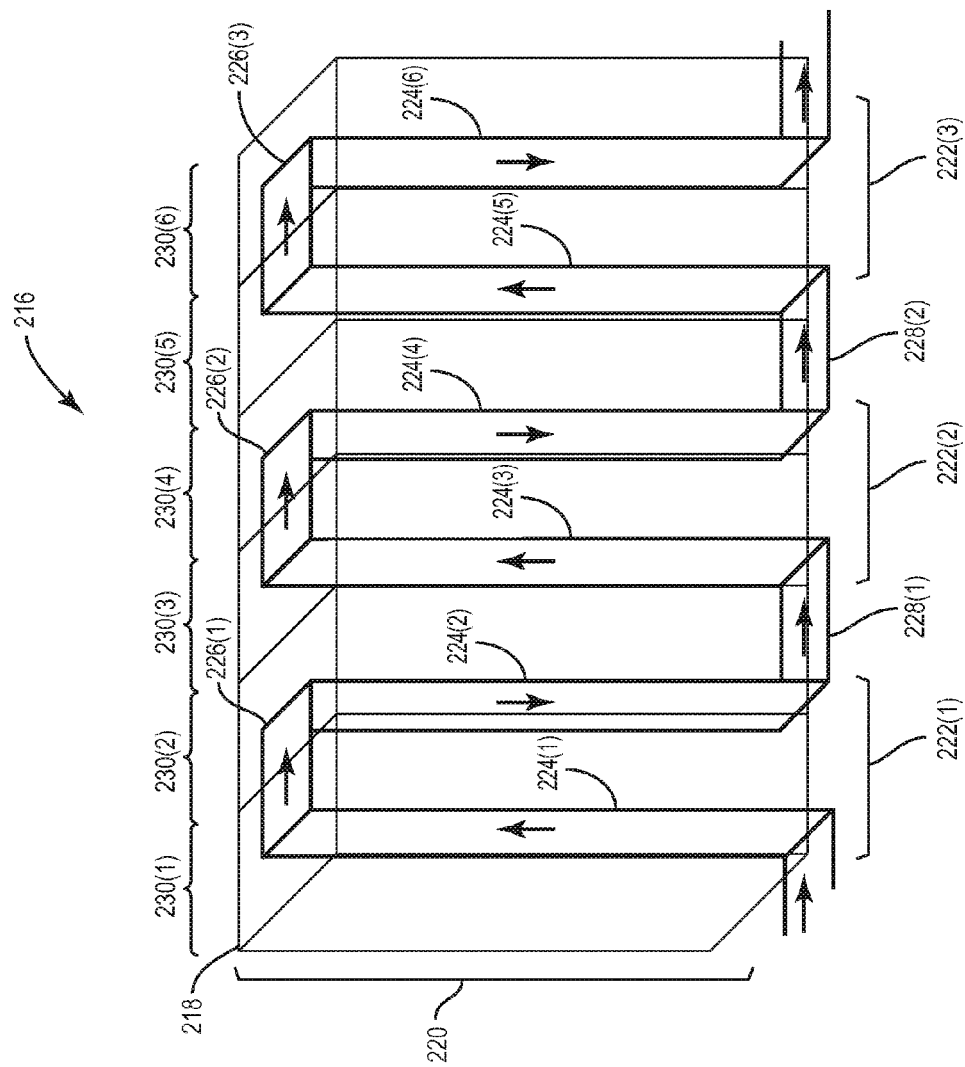

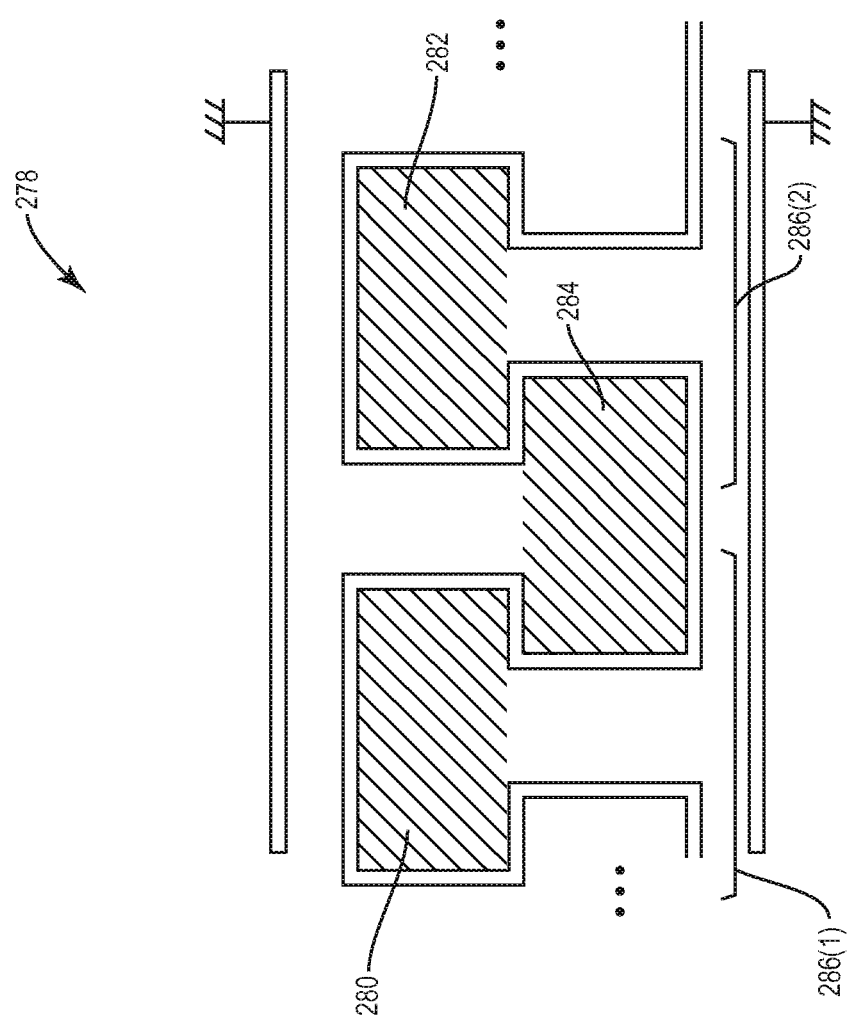

TUNABLE SLOW-WAVE TRANSMISSION LINE

RELATED APPLICATIONS

The present application claims the benefit of U.S. Provisional Patent Application No. 62/074,457, filed Nov. 3, 2014, the disclosure of which is incorporated herein by reference in its entirety.

The present application claims priority to and is a continuation-in-part of U.S. patent application Ser. No. 14/921,218, filed Oct. 23, 2015, entitled "SLOW-WAVE TRANSMISSION LINE FORMED IN A MULTI-LAYER SUBSTRATE," which claims priority to U.S. Provisional Patent Application No. 62/074,457, filed Nov. 3, 2014, the disclosures of which are incorporated herein by reference in their entireties.

FIELD OF THE DISCLOSURE

The present disclosure relates to transmission lines, and specifically to transmission lines configured to transmit slow-wave signals.

BACKGROUND

Mobile computing devices, such as mobile phones and computer tablets, continue to employ designs focused on decreasing size requirements. The trend toward miniaturization of mobile computing devices requires the use of smaller internal components. Tunable filters are one such internal component that affect the overall size of a mobile computing device. One way to construct a tunable filter is through the use of transmission lines. Notably, tunable filters require slower wave signals, and thus, transmission lines used to construct tunable filters should be designed to transmit wave signals at compatible speeds. Three factors that affect the speed at which transmission lines transmit wave signals are size, permittivity ($\in$), and permeability ($\mu$).

FIG. 1 illustrates an exemplary transmission line 10 disposed along a ground plane 12. The transmission line 10 is separated from the ground plane 12 by a distance (D), wherein, as a non-limiting example, the distance (D) may include a dielectric layer (not shown). Further, the transmission line 10 is employed using a low cost, low permittivity ($\in_{low}$) material. The speed at which a wave signal is transmitted (the velocity factor (Vf) (not shown)) by the transmission line 10 is inversely proportional to the square root of the relative permittivity (Vf=1/$\sqrt{\in(r)}$). Thus, the $\in_{low}$ material causes the transmission line 10 to have a higher Vf as compared to transmission lines constructed using a higher permittivity material. To delay a transmitted wave signal in light of the higher Vf, the transmission line 10 is designed with a longer length ($L_{long}$) so as to require a transmitted wave signal to travel a further distance. Additionally, the transmission line 10 is designed with a wider width ($W_{wide}$) to reduce loss. Therefore, to transmit a wave signal at a speed that is compatible with a tunable filter while achieving low loss, the transmission line 10 requires a larger area to overcome the higher Vf associated with the $\in_{low}$ material. However, the larger area of the transmission line 10 may not be desirable for tunable filters implemented in mobile computing devices with limited area requirements.

To transmit a wave signal at a speed that is compatible with a tunable filter while requiring less area than the transmission line 10, a transmission line may be constructed using a high permittivity $\in_{high}$ material. In this manner, FIG. 2 illustrates an exemplary transmission line 14 employed using a high cost, $\in_{high}$ material disposed along a ground plane 16. Notably, the transmission line 14 is separated from the ground plane 16 by a distance (D). The $\in_{high}$ material causes the transmission line 14 to have a lower Vf as compared to transmission lines constructed using a $\in_{low}$ material, such as the transmission line 10. Because the transmission line 14 has a lower Vf, a transmitted wave signal does not need to be delayed by employing a longer length ($L_{long}$), allowing the transmission line 14 to be designed with a shorter length ($L_{short}$). However, the transmission line 14 is also designed with narrower width ($W_{narrow}$), which causes increased loss. Thus, although the transmission line 14 consumes less area than the transmission line 10, the transmission line 14 incurs greater loss and requires a higher cost material.

Therefore, it would be advantageous to employ a transmission line designed to transmit wave signals at speeds compatible with tunable filters while achieving reduced area, costs, and loss.

SUMMARY

The present disclosure relates to a tunable slow-wave transmission line. The tunable slow-wave transmission line is formed in a multi-layer substrate and includes an undulating signal path. The undulating signal path includes at least two loop structures, wherein each loop structure includes at least two via structures connected by at least one intra-loop trace. The undulating signal path further includes at least one inter-loop trace connecting the at least two loop structures. The tunable slow-wave transmission line includes a first ground structure disposed along the undulating signal path. Further, the tunable slow-wave transmission line includes one or more circuits that may alter a signal transmitted in the tunable slow-wave transmission line so as to tune a frequency of the signal.

According to one embodiment, a tunable slow-wave transmission line formed in a multi-layer substrate is disclosed. The tunable slow-wave transmission line comprises an undulating signal path comprising at least two loop structures, each of the at least two loop structures comprising at least two via structures connected by at least one intra-loop trace. The tunable slow-wave transmission line further comprises at least one inter-loop trace connecting the at least two loop structures. The tunable slow-wave transmission line further comprises a first ground structure disposed along the undulating signal path. Notably, a loop inductance is formed within each of the at least two loop structures. The tunable slow-wave transmission line further comprises a first circuit coupled in parallel with a first loop structure of the at least two loop structures and comprising at least one electronic component that is in parallel with the first loop structure.

According to another embodiment, a tunable slow-wave transmission line formed in a multi-layer substrate is disclosed. The tunable slow-wave transmission line comprises an undulating signal path comprising at least two loop structures, each of the at least two loop structures comprising at least two via structures connected by at least one intra-loop trace. The tunable slow-wave transmission line further comprises at least one inter-loop trace connecting the at least two loop structures. The tunable slow-wave transmission line further comprises a first ground structure disposed along the undulating signal path. Notably, a loop inductance is formed within each of the at least two loop structures. The tunable slow-wave transmission line further comprises a first circuit coupled to an intra-loop trace of the at least one intra-loop trace of a first loop structure of the at least two loop structures and comprising at least one electronic component.

According to another embodiment, a tunable slow-wave transmission line formed in a multi-layer substrate is disclosed. The tunable slow-wave transmission line comprises an undulating signal path comprising at least two loop structures, each of the at least two loop structures comprising at least two via structures connected by at least one intra-loop trace. The tunable slow-wave transmission line further comprises at least one inter-loop trace connecting the at least two loop structures. The tunable slow-wave transmission line further comprises a first ground structure disposed along the undulating signal path. Notably, a loop inductance is formed within each of the at least two loop structures. The tunable slow-wave transmission line further comprises a first floating loop structure comprising a series element and wherein a portion of the first floating loop structure resides within a space of a first loop structure of the at least two loop structures, and the first floating loop structure is electrically isolated from the undulating signal path.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure;

FIG. 8D is a diagram of an exemplary slow-wave transmission line with an undulating signal path, wherein the slow-wave transmission line is disposed in a T-shaped pattern and employs T-shaped ground bars;

FIG. 8E is a diagram of an exemplary slow-wave transmission line with an undulating signal path, wherein the slow-wave transmission line is disposed in a P-shaped pattern and employs L-shaped ground bars;

FIG. 11 is a diagram of an exemplary slow-wave transmission line employing a shield structure along an undulating signal path;

FIG. 15B is a diagram of an exemplary slow-wave transmission line with an undulating signal path, wherein the slow-wave transmission line includes insulator layers formed from a high permeability material;

DETAILED DESCRIPTION

Figure 1:
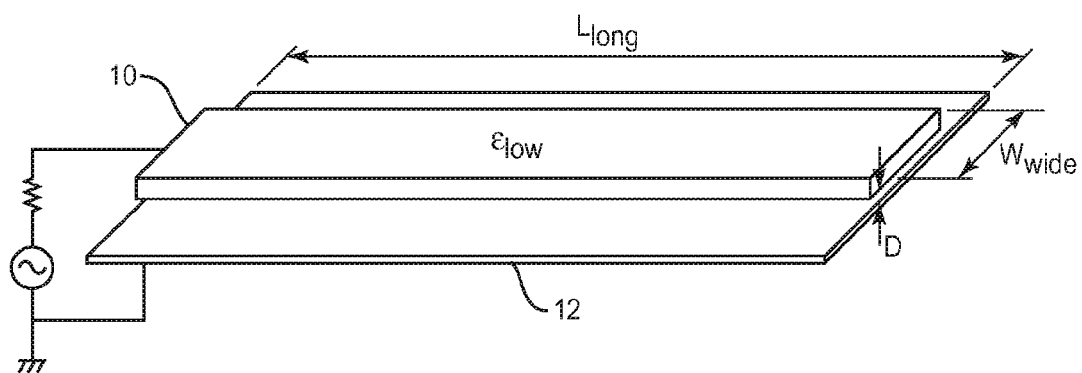
FIG. 1 is a diagram of an exemplary transmission line.
Figure 2:
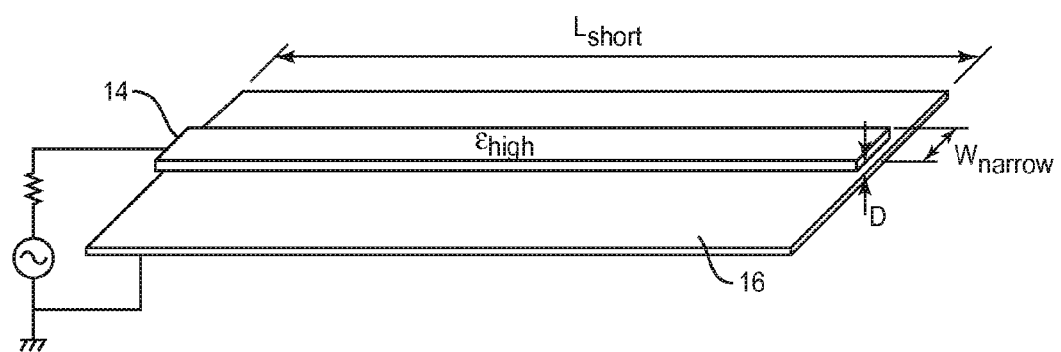
FIG. 2 is a diagram of an exemplary transmission line with a shorter length and narrower width.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above," or "upper" or "lower," or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a tunable slow-wave transmission line. The tunable slow-wave transmission line is formed in a multi-layer substrate and includes an undulating signal path. The undulating signal path includes at least two loop structures, wherein each loop structure includes at least two via structures connected by at least one intra-loop trace. The undulating signal path further includes at least one inter-loop trace connecting the at least two loop structures. The tunable slow-wave transmission line includes a first ground structure disposed along the undulating signal path. Further, the tunable slow-wave transmission line includes one or more circuits that may alter a signal transmitted in the tunable slow-wave transmission line so as to tune a frequency of the signal.

Figure 3:
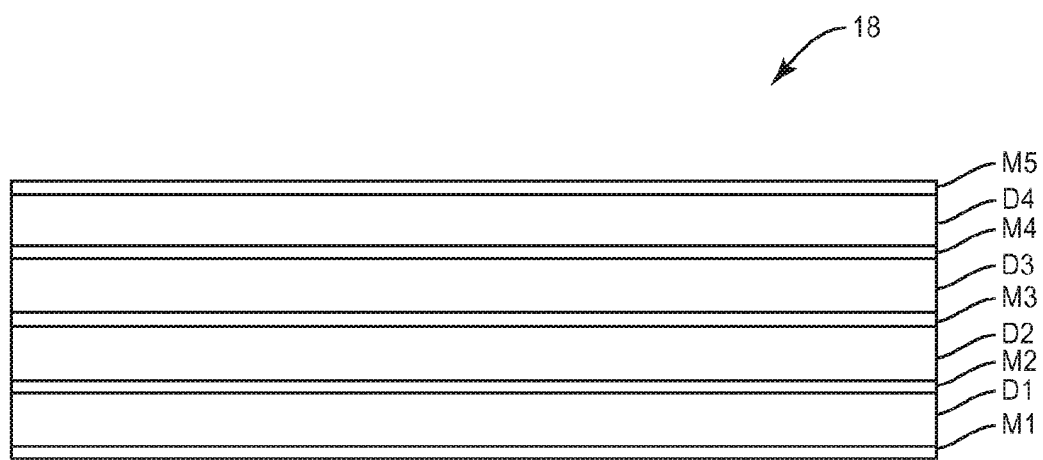
FIG. 3 is a cross-sectional diagram of an exemplary multi-layer laminate printed circuit board (PCB)
Figure 4A:
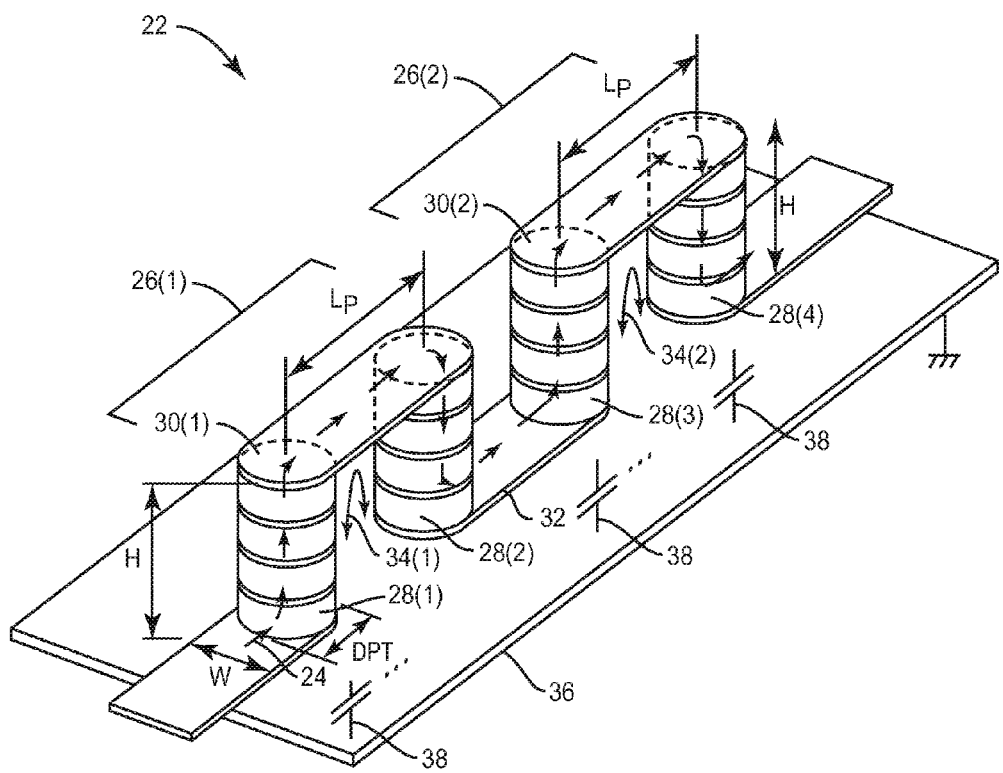
FIGS. 4A-4C are diagrams of exemplary slow-wave transmission lines with an undulating signal path.

Before discussing details of the slow-wave transmission line for transmitting slow-wave signals beginning in FIG. 4A, details of a multi-layer laminate printed circuit board (PCB) are first discussed. FIG. 3 illustrates an exemplary multi-layer laminate PCB 18 employing metal layers M1-M5 alternating with dielectric layers D1-D4. Each of the metal layers M1-M5 is constructed of a conductive material. Further, each dielectric layer D1-D4 is constructed of a substrate material having a particular dielectric value. To form the multi-layer laminate PCB 18, vias (not shown) used to electrically connect corresponding metal layers M1-M5 are drilled in corresponding dielectric layers D1-D4 and clad or plated with a conductive material. Additionally, the metal layers M1-M5 are disposed in an alternating manner with the dielectric layers D1-D4, wherein circuit traces are etched into each metal layer M1-M5, or alternatively, circuit traces are metal-plated and have dielectric material pressed onto the metal. The metal and dielectric layers M1-M5, D1-D4 are connected using a lamination process to form the multi-layer laminate PCB 18. In this manner, the multi-layer laminate PCB 18 may support circuits designed to be fabricated in a multi-layer substrate.

FIG. 4A illustrates an exemplary slow-wave transmission line 22 with an undulating signal path 24 formed in a multi-layer substrate. The undulating signal path 24 in the slow-wave transmission line 22 employs loop structures 26(1), 26(2). The loop structure 26(1) includes via structures 28(1), 28(2) connected by an intra-loop trace 30(1). Similarly, the loop structure 26(2) includes via structures 28(3), 28(4) connected by an intra-loop trace 30(2). The undulating signal path 24 further includes an inter-loop trace 32 that connects the two loop structures 26(1), 26(2). Constructing the slow-wave transmission line 22 with the undulating signal path 24 in this manner increases the distance that a slow-wave signal must travel through the slow-wave transmission line 22 as compared to a transmission line employing a straight, non-undulating signal path having a similar length. Requiring the slow-wave signal to travel an increased distance delays the slow-wave signal so as to be more compatible with speeds required by tunable filters without incurring an increase in area.

Additionally, constructing the slow-wave transmission line 22 as described above causes each loop structure 26(1), 26(2) to form a corresponding loop inductance 34(1), 34(2). The loop inductance 34(1) is formed between the via structures 28(1), 28(2) and the intra-loop trace 30(1), while the loop inductance 34(2) is formed between the via structures 28(3), 28(4) and the intra-loop trace 30(2). Further, the slow-wave transmission line 22 includes a first ground structure 36 disposed along the undulating signal path 24, thus forming a first distributed capacitance 38 between the undulating signal path 24 and the first ground structure 36. Although the first ground structure 36 is substantially planar in this embodiment, other embodiments may employ the first ground structure 36 in alternative shapes.

Resonance generated by an inductance-capacitance (LC) network formed by the loop inductances 34(1), 34(2), and the first distributed capacitance 38 increases the effective dielectric constant (i.e., increases the relative permittivity $\in(r)$) of the slow-wave transmission line 22. Such an increase in relative permittivity $\in(r)$ reduces the corresponding velocity factor (Vf) (Vf=1/$\sqrt{\in(r)}$), thus reducing the speed of the slow-wave signal. Therefore, the slow-wave transmission line 22 is designed to transmit slow-wave signals at speeds compatible with tunable filters by forcing the slow-wave signal to travel a further distance as described above, as well as by slowing down the slow-wave signal using the LC network.

Notably, the slow-wave transmission line 22 may achieve the described delay and speed reduction of the slow-wave signal even when employing a low cost, low permittivity ($\in_{low}$) material having a high velocity factor (Vf). Thus, the slow-wave transmission line 22 may be designed to achieve such benefits while avoiding increased cost associated with high cost, high permittivity ($\in_{high}$) material.

Additionally, in this embodiment, the loop structure 26(1) is constructed so that the via structure 28(1) is disposed within a lateral pitch ($L_P$) of the via structure 28(2), wherein the lateral pitch ($L_P$) is less than a height (H) of each via structure 28(1), 28(2). The loop structure 26(2) is similarly constructed so that the via structure 28(3) is disposed within the lateral pitch ($L_P$) of the via structure 28(4), wherein the lateral pitch ($L_P$) is less than a height (H) of each via structure 28(3), 28(4). Notably, each via structure 28(1)-28(4) has a corresponding width (W) and depth (DPT). Constructing the loop structures 26(1), 26(2) in this manner increases the corresponding loop inductances 34(1), 34(2), thus allowing the LC network in the slow-wave transmission line 22 to further reduce the speed at which the slow-wave signal is transmitted.

Figure 4B:
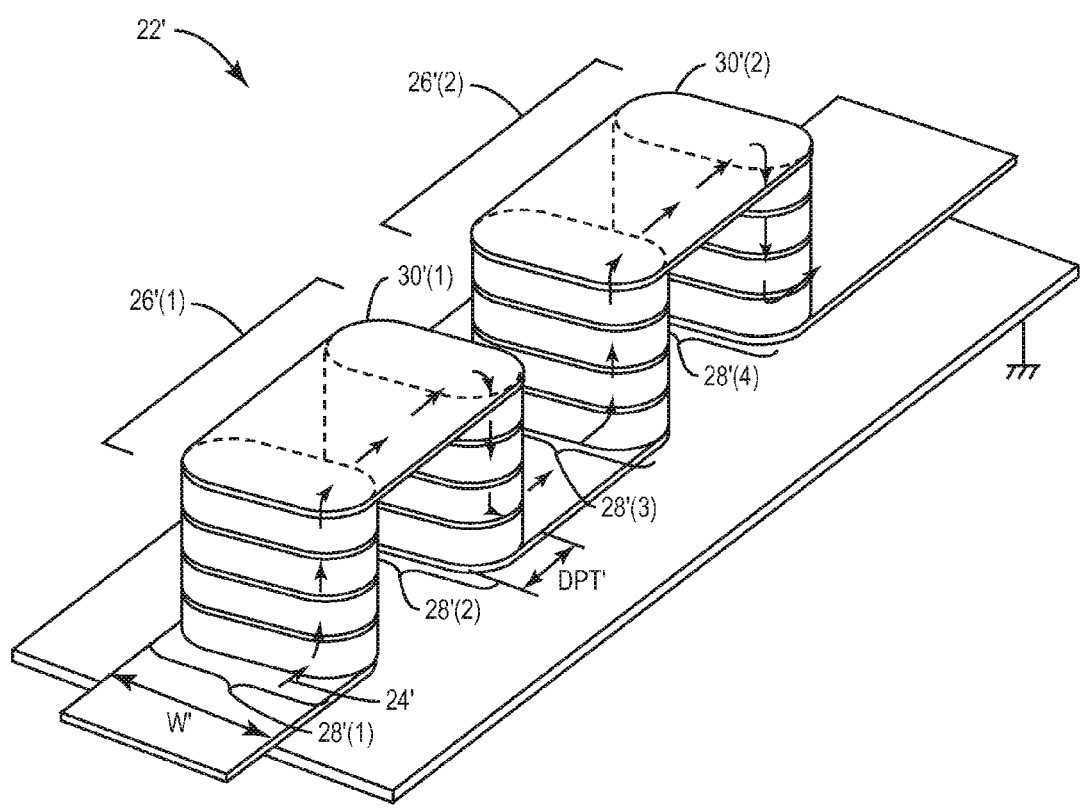

While the slow-wave transmission line 22 in FIG. 4A is designed to delay and reduce the speed of a slow-wave signal as previously described, alternative embodiments that achieve reduced loss may be employed. In this manner, FIG. 4B illustrates an exemplary slow-wave transmission line 22' with an undulating signal path 24'. The slow-wave transmission line 22' includes certain common components with the slow-wave transmission line 22 in FIG. 4A. Such common components that have an associated number "X" in FIG. 4A are denoted by a number "X'" in FIG. 4B, and thus will not be re-described herein.

The slow-wave transmission line 22' includes a loop structure 26'(1) constructed with via structures 28'(1), 28'(2) connected by an intra-loop trace 30'(1). Similarly, the slow-wave transmission line 22' includes a loop structure 26'(2) constructed with via structures 28'(3), 28'(4) connected by an intra-loop trace 30'(2). Notably, the via structures 28'(1)-28'(4) are elongated via structures, wherein a width (W') of each via structure 28'(1)-28'(4) is approximately equal to at least twice a depth (DPT') of each via structure 28'(1)-28'(4), as opposed to the width (W) that is approximately equal to the depth (DPT) of each via structure 28(1)-28(4) in FIG. 4A. Because the via structures 28'(1)-28'(4) employ a width (W') approximately equal to at least twice the depth (DPT'), the corresponding intra-loop traces 28'(1), 28'(2) have a substantially similar width (W'). Further, a resistance (R) of a conductive material is inversely proportional to area (A), and thus, the larger width (W') of the via structures 28'(1)-28'(4) and the intra-loop traces 28'(1), 28'(2) reduces the resistance (R) of the slow-wave transmission line 22' as compared to that of the slow-wave transmission line 22 in FIG. 4A. In this manner, the lower resistance (R) reduces the loss experienced by a slow-wave signal transmitted through the slow-wave transmission line 22'.

Figure 4C:
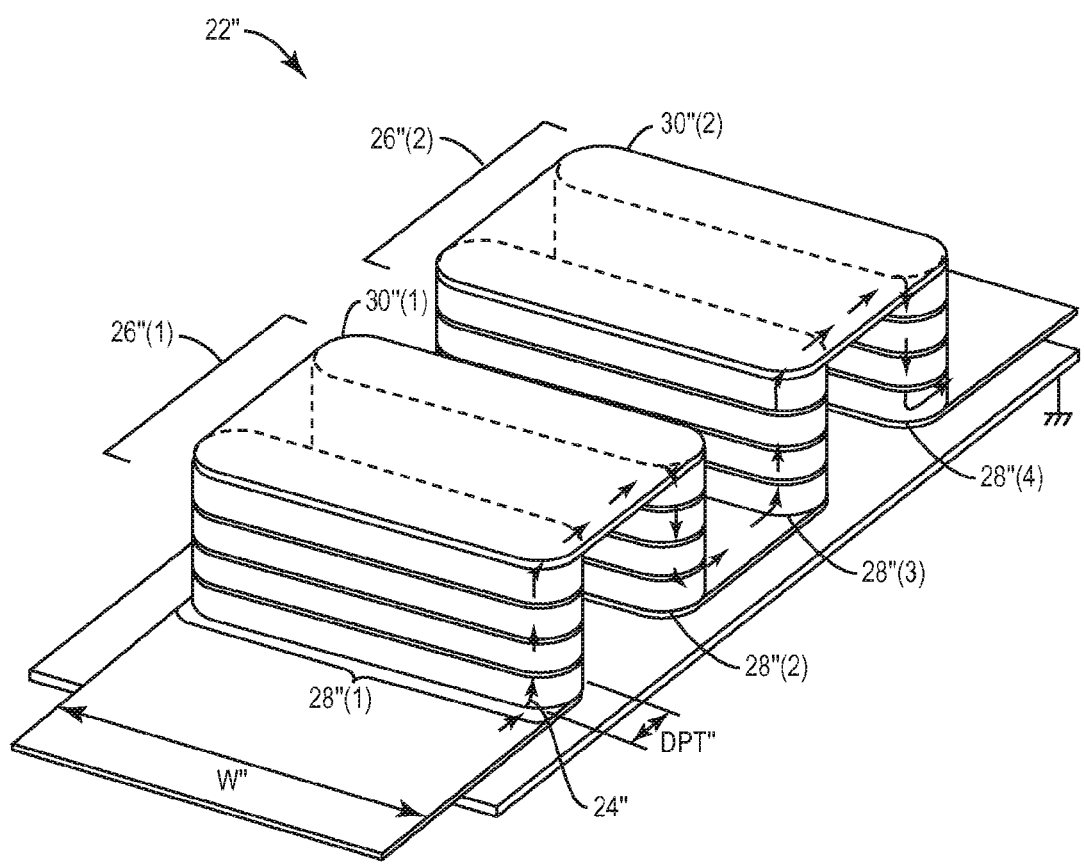

Similarly, FIG. 4C illustrates an exemplary slow-wave transmission line 22" with an undulating signal path 24". The slow-wave transmission line 22" also includes certain common components with the slow-wave transmission line 22 in FIG. 4A. Such common components that have an associated number "X" in FIG. 4A are denoted by a number "X'''" in FIG. 4C, and thus will not be re-described herein. In this manner, via structures 28"(1)-28"(4) are elongated via structures, wherein a width (W") of each via structure 28"(1)-28"(4) is approximately equal to at least five times a depth (DPT") of each via structure 28"(1)-28"(4). Further, because the via structures 28"(1)-28"(4) employ a width (W") approximately equal to at least five times the depth (DPT"), corresponding intra-loop traces 30"(1), 30"(2) have a substantially similar width (W"). Thus, the larger width (W") of the via structures 28"(1)-28"(4) and the intra-loop traces 30"(1), 30"(2) reduces the resistance (R), and hence, the loss, of the slow-wave transmission line 22" as compared to that of the slow-wave transmission lines 22, 22' in FIGS. 4A, 4B, respectively.

Figure 5A:
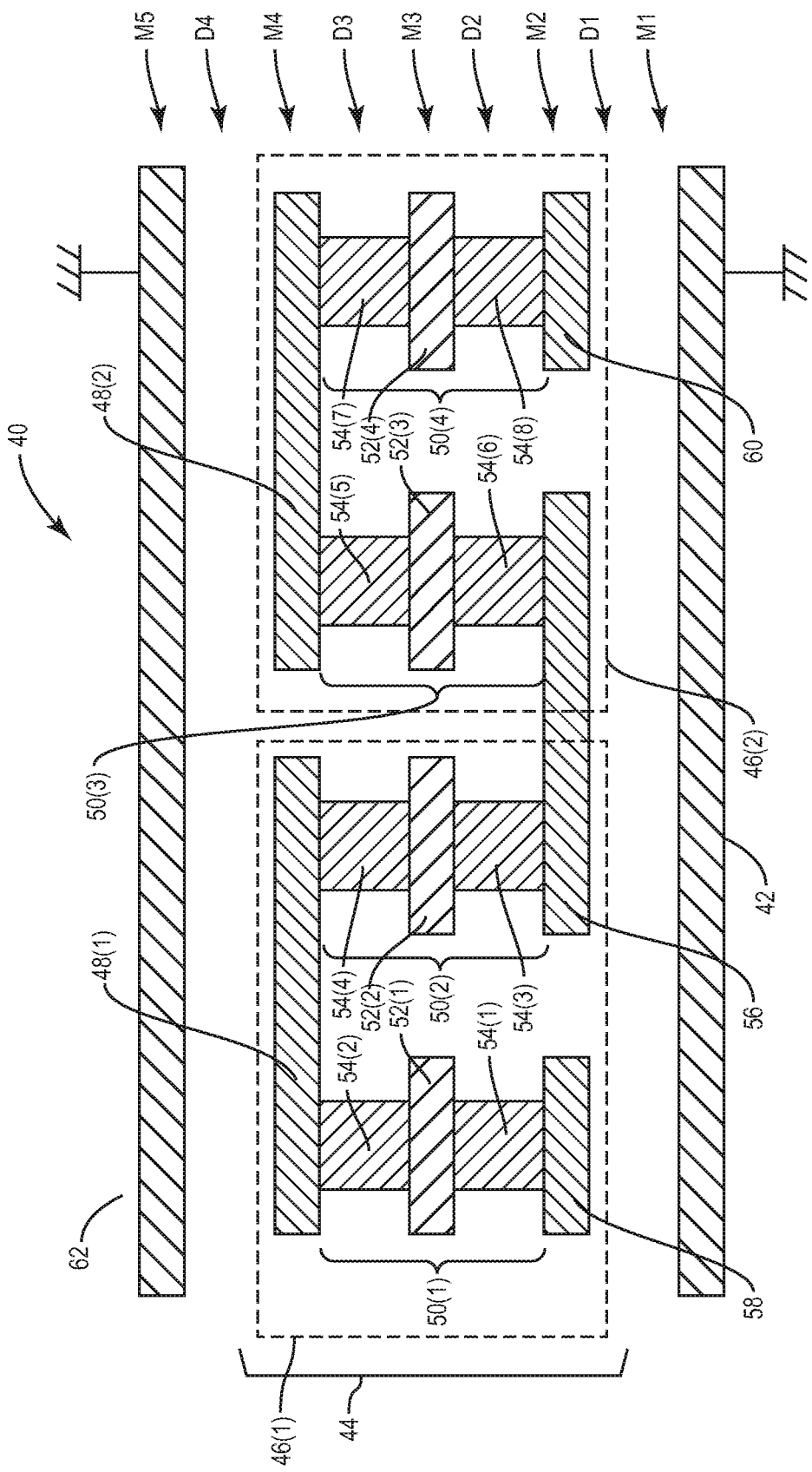
FIG. 5A is a cross-sectional diagram of an exemplary slow-wave transmission line with an undulating signal path.

FIG. 5A illustrates a cross-sectional diagram of an exemplary slow-wave transmission line 40 similar to the slow wave transmission lines 22, 22', and 22" of FIGS. 4A-4C. The slow-wave transmission line 40 includes a first ground structure 42 disposed in a first metal layer (M1). A first dielectric layer (D1) is disposed above the first ground structure 42. Additionally, an undulating signal path 44 is included above the D1 layer. In this manner, the undulating signal path 44 includes loop structures 46(1), 46(2). The loop structure 46(1) includes an intra-loop trace 48(1) disposed in a fourth metal layer (M4) that connects via structures 50(1), 50(2). The via structure 50(1) employs an inter-via trace 52(1) disposed in a third metal layer (M3) that connects vias 54(1), 54(2) disposed in a second and third dielectric layer (D2, D3), respectively. The via structure 50(2) employs an inter-via trace 52(2) disposed in M3 that connects vias 54(3), 54(4) disposed in D2, D3, respectively. The loop structure 46(2) includes an intra-loop trace 48(2) disposed in M4 that connects via structures 50(3), 50(4). The via structure 50(3) employs an inter-via trace 52(3) disposed in M3 that connects vias 54(5), 54(6) disposed in D3, D2, respectively. The via structure 50(4) includes an inter-via trace 52(4) disposed in M3 that connects vias 54(7), 54(8) disposed in D3, D2, respectively.

Further, the slow-wave transmission line 40 includes an intra-loop trace 56 disposed in a second metal layer (M2) that connects the loop structures 46(1), 46(2). Segment traces 58, 60 disposed in M2 are connected to the vias 54(1), 54(8), respectively, to complete the undulating signal path 44. Notably, this embodiment includes a second ground structure 62 disposed in a fifth metal layer (M5) above a fourth dielectric layer (D4) along the undulating signal path 44 opposite of the first ground structure 42. As described in further detail below, the second ground structure 62 forms a second distributive capacitance (not shown) between the undulating signal path 44 and the second ground structure 62.

Figure 5B:
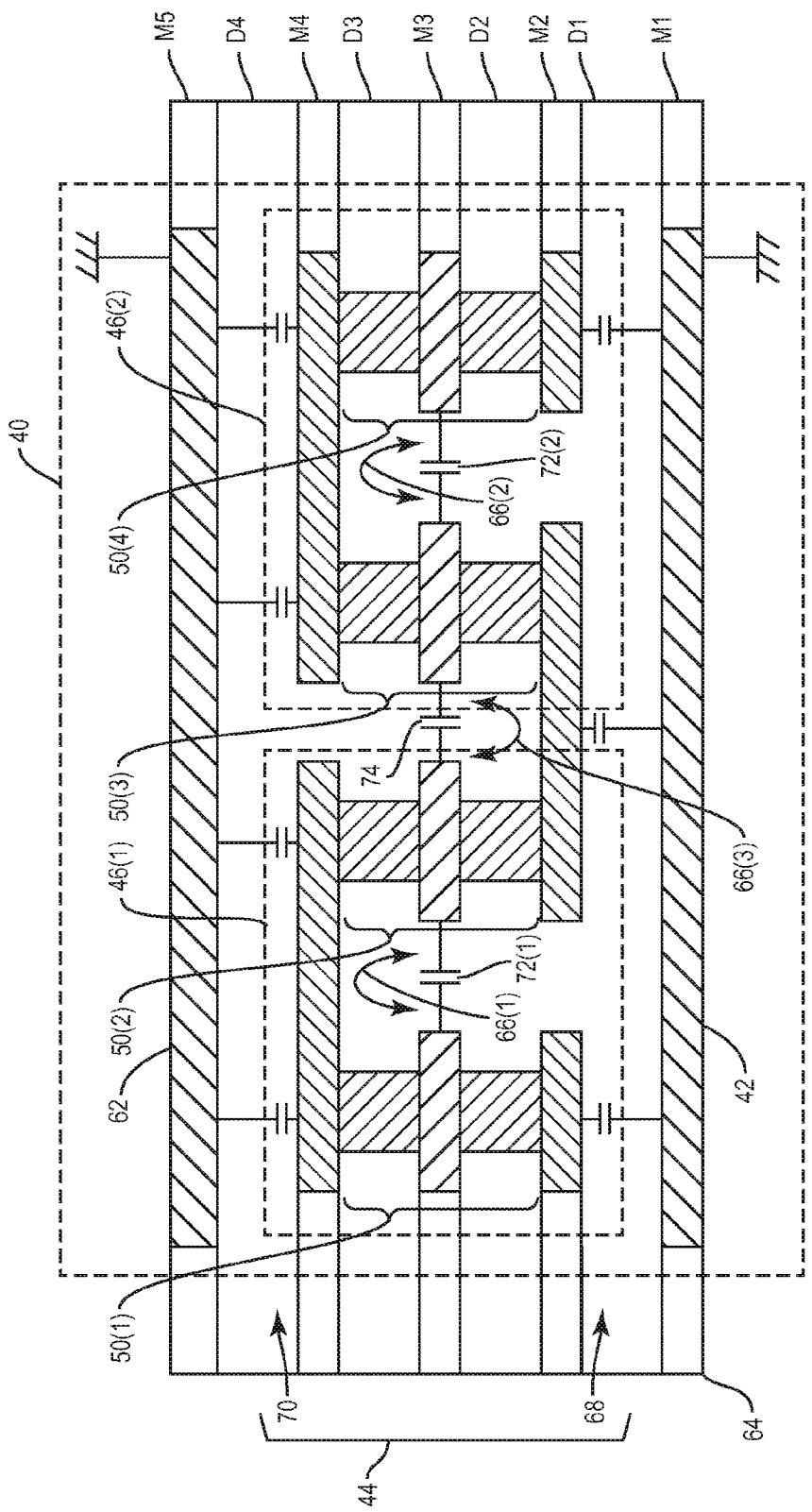
FIG. 5B is a cross-sectional diagram of the slow-wave transmission line with the undulating signal path in FIG. 5A disposed in a multi-layer laminate PCB.

FIG. 5B illustrates the slow-wave transmission line 40 of FIG. 5A disposed in an exemplary multi-layer laminate PCB 64 similar to the multi-layer laminate PCB 18 of FIG. 3. Notably, the slow-wave transmission line 40 is disposed in a U-shaped pattern, wherein the loop structures 46(1), 46(2) are disposed adjacent to one another and each loop structure 46(1), 46(2) is employed with a substantially equal size and U-shape. Further, in addition to loop inductances 66(1), 66(2) formed within the loop structures 46(1), 46(2), respectively, a loop inductance 66(3) is formed between the loop structures 46(1), 46(2). Because the loop structures 46(1), 46(2) are disposed adjacent to one another and are substantially the same size, the loop inductance 66(3) is substantially equal to each of the loop inductances 66(1), 66(2).

Further, a first distributive capacitance 68 is formed between the first ground structure 42 and the undulating signal path 44, and a second distributive capacitance 70 is formed between the second ground structure 62 and the undulating signal path 44. Intra-loop capacitances 72(1), 72(2) are formed between the via structures 50(1), 50(2) and 50(3), 50(4), respectively, and an inter-loop capacitance 74 is formed between the via structure 50(2) and the via structure 50(3). Thus, the first and second distributive capacitances 68, 70, the intra-loop capacitances 72(1), 72(2), and the inter-loop capacitance 74 combine with the loop inductances 66(1), 66(2), and 66(3) to form an LC network. In this manner, the slow-wave transmission line 40 is designed to transmit slow-wave signals at speeds compatible with tunable filters by forcing the slow-wave signal to travel a further distance, as well as by slowing down the slow-wave signal using the LC network.

Figure 6A:
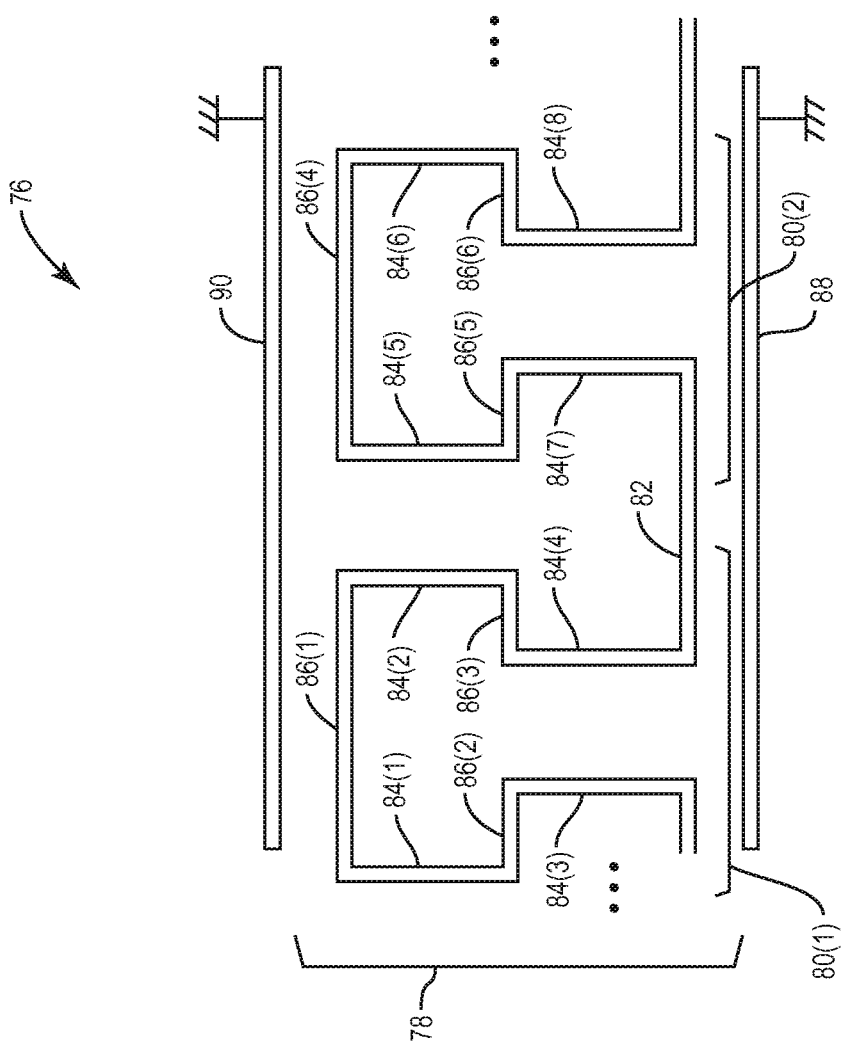
FIG. 6A is a diagram of an exemplary slow-wave transmission line with an undulating signal path, wherein the slow-wave transmission line is disposed in a T-shaped pattern.

In addition to the U-shaped slow-wave transmission line 40 in FIGS. 5A, 5B, other embodiments may employ slow-wave transmission lines in alternative shapes and achieve similar functionality. In this manner, FIG. 6A illustrates an exemplary slow-wave transmission line 76 disposed in a T-shaped pattern. The slow-wave transmission line 76 includes an undulating signal path 78 that includes loop structures 80(1), 80(2) connected by an inter-loop trace 82. Notably, the T-shaped pattern is also formed between the loop structures 80(1), 80(2). Because the loop structure 80(1) is disposed in the T-shaped pattern, the loop structure 80(1) includes four via structures 84(1)-84(4) and three intra-loop traces 86(1)-86(3). In this manner, the via structure 84(1) is connected to the via structures 84(2), 84(3) by the intra-loop traces 86(1), 86(2), respectively. Further, the via structure 84(2) is connected to the via structure 84(4) by the intra-loop trace 86(3). Similarly, the loop structure 80(2) includes four via structures 84(5)-84(8) and three intra-loop traces 86(4)-86(6). The via structure 84(5) is connected to the via structures 84(6), 84(7) by the intra-loop traces 86(4), 86(5), respectively. Further, the via structure 84(6) is connected to the via structure 84(8) by the intra-loop trace 86(6). First and second ground structures 88, 90 are also included in the slow-wave transmission line 76.

Figure 6B:
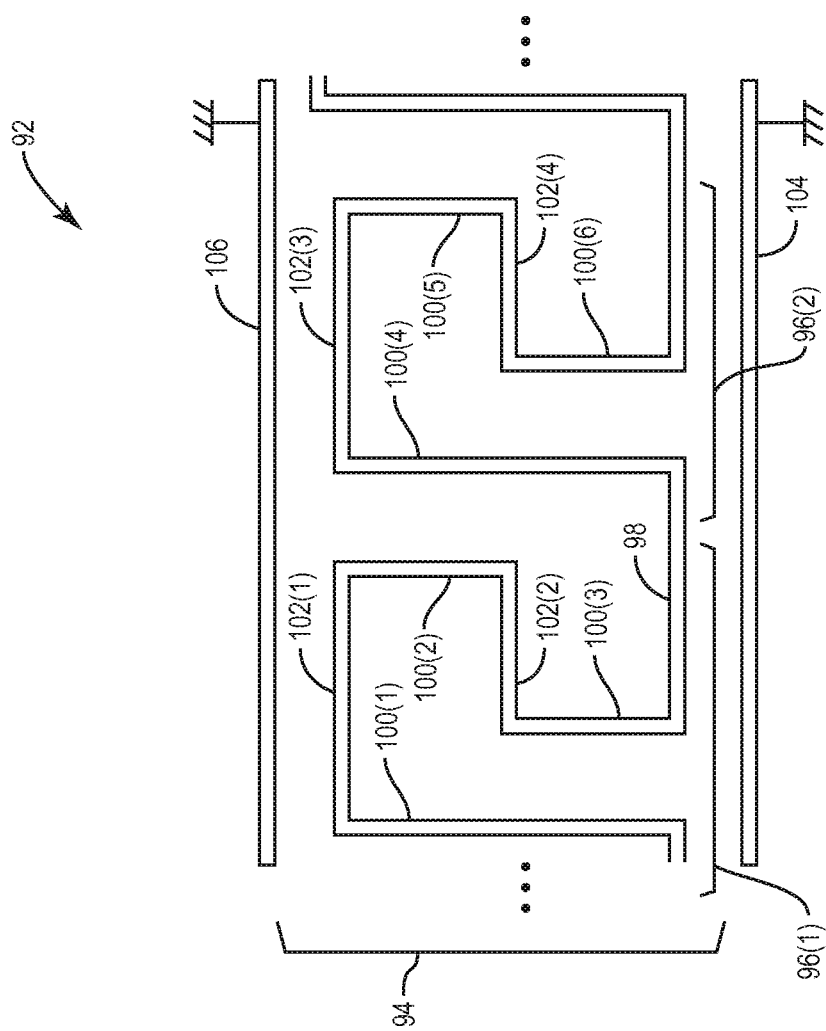
FIG. 6B is a diagram of an exemplary slow-wave transmission line with an undulating signal path, wherein the slow-wave transmission line is disposed in a P-shaped pattern.

Further, FIG. 6B illustrates an exemplary slow-wave transmission line 92 disposed in a P-shaped pattern. The slow-wave transmission line 92 includes an undulating signal path 94 having loop structures 96(1), 96(2) connected by an inter-loop trace 98. Notably, the P-shaped pattern is also formed between the loop structures 96(1), 96(2). Because the loop structure 96(1) is disposed in the P-shaped pattern, the loop structure 96(1) includes three via structures 100(1)-100(3) and two intra-loop traces 102(1), 102(2). In this manner, the via structure 100(1) is connected to the via structure 100(2) by the intra-loop trace 102(1). Further, the via structure 100(2) is connected to the via structure 100(3) by the intra-loop trace 102(2). Similarly, the loop structure 96(2) includes three via structures 100(4)-100(6) and two intra-loop traces 102(3), 102(4). The via structure 100(4) is connected to the via structure 100(5) by the intra-loop trace 102(3). Further, the via structure 100(5) is connected to the via structure 100(6) by the intra-loop trace 102(4). First and second ground structures 104, 106 are also included in the slow-wave transmission line 92. As described in detail below, the T-shaped slow-wave transmission line 76 and the P-shaped slow-wave transmission line 92 are configured to transmit slow-wave signals with similar advantages as those provided by the U-shaped slow-wave transmission line 40 in FIGS. 5A and 5B.

Figure 7A:
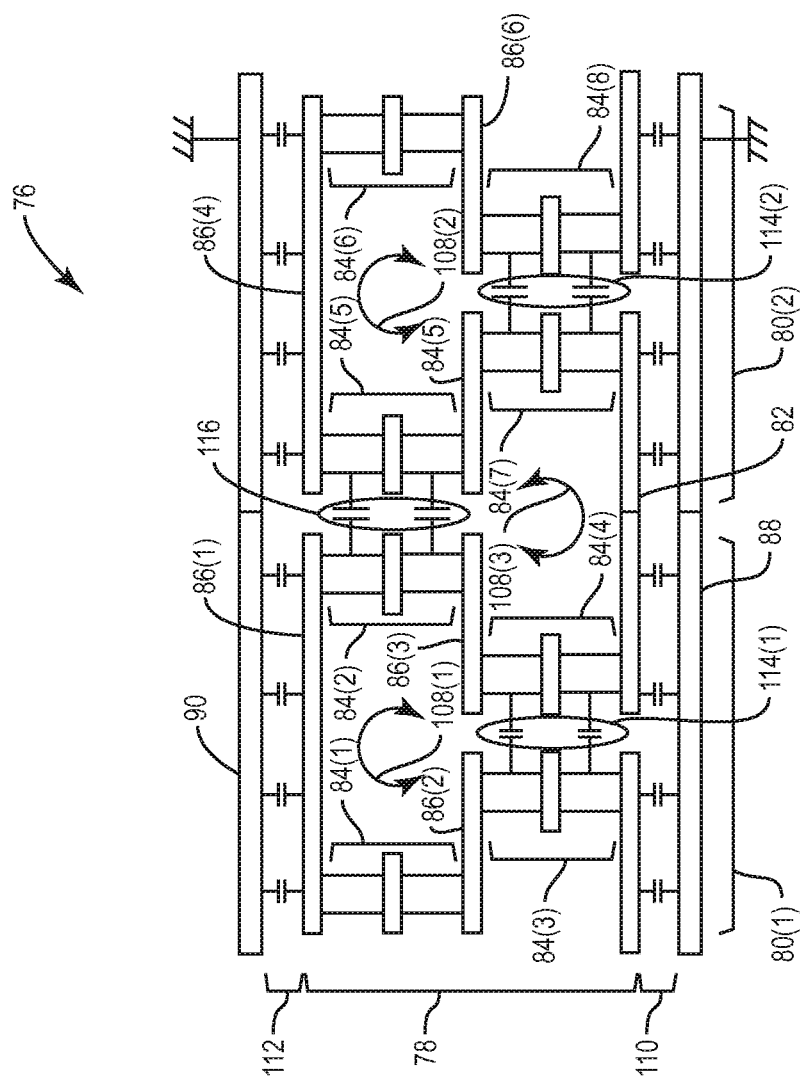
FIG. 7A is a cross-sectional diagram of the slow-wave transmission line disposed in the T-shaped pattern in FIG. 6A.

FIG. 7A is a cross-sectional diagram of the slow-wave transmission line 76 disposed in the T-shaped pattern in FIG. 6A. The slow-wave transmission line 76 is disposed in a multi-layer substrate similar to the slow-wave transmission line 40 in FIG. 5B. Thus, the via structures 84(1)-84(4) in the loop structure 80(1) and the via structures 84(5)-84(8) in the loop structure 80(2) are constructed using vias and intra-via segments as described with reference to the slow-wave transmission line 40, and thus will not be re-described herein.

Additionally, loop inductances 108(1), 108(2) are formed within the loop structures 80(1), 80(2), respectively. A loop inductance 108(3) is also formed between the loop structures 80(1), 80(2). A first distributed capacitance 110 is formed between the first ground structure 88 and the undulating signal path 78. A second distributed capacitance 112 is formed between the second ground structure 90 and the undulating signal path 78. Further, intra-loop capacitances 114(1), 114(2) are formed between the via structures 84(3), 84(4) and 84(7), 84(8), respectively. An inter-loop capacitance 116 is formed between the loop structures 80(1), 80(2). Thus, the loop inductances 108(1)-108(3), the first and second distributed capacitances 110, 112, the intra-loop capacitances 114(1)-114(2), and the inter-loop capacitance 116 combine to form an LC network. In this manner, the slow-wave transmission line 76 is designed to transmit slow-wave signals at speeds compatible with tunable filters by forcing the slow-wave signal to travel a further distance, as well as by slowing down the slow-wave signal using the LC network.

Figure 7B:
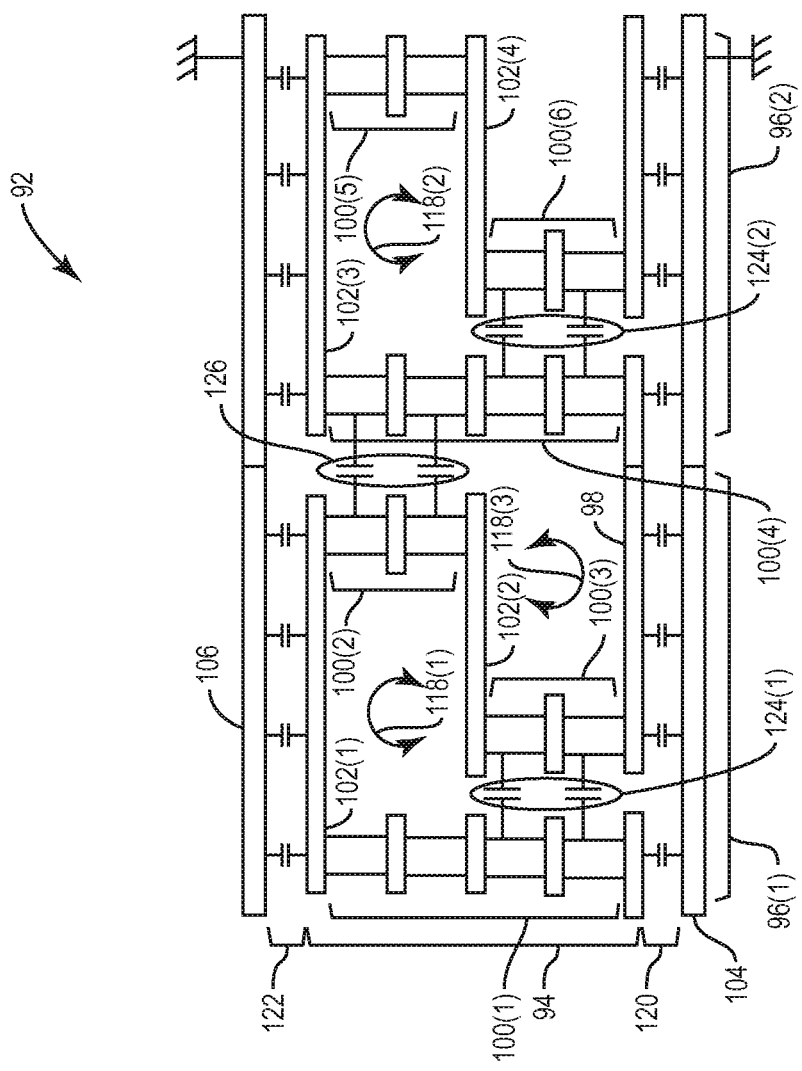
FIG. 7B is a cross-sectional diagram of the slow-wave transmission line disposed in the P-shaped pattern in FIG. 6B.

FIG. 7B is a cross-sectional diagram of the slow-wave transmission line 92 disposed in the P-shaped pattern in FIG. 6B. The slow-wave transmission line 92 is disposed in a multi-layer substrate similar to the slow-wave transmission line 40 in FIG. 5B. Thus, the via structures 100(1)-100(3) in the loop structure 96(1) and the via structures 100(4)-100(6) in the loop structure 96(2) are constructed using vias and intra-via segments as described with reference to the slow-wave transmission line 40, and thus will not be re-described herein.

Additionally, loop inductances 118(1), 118(2) are formed within the loop structures 96(1), 96(2), respectively. A loop inductance 118(3) is also formed between the loop structures 96(1), 96(2). A first distributed capacitance 120 is formed between the first ground structure 104 and the undulating signal path 94. A second distributed capacitance 122 is formed between the second ground structure 106 and the undulating signal path 94. Further, intra-loop capacitances 124(1), 124(2) are formed between the via structures 100(1), 100(3) and 100(4), 100(6), respectively. An inter-loop capacitance 126 is formed between the loop structures 96(1), 96(2). Thus, the loop inductances 118(1)-118(3), the first and second distributed capacitances 120, 122, the intra-loop capacitances 124(1)-124(2), and the inter-loop capacitance 126 combine to form an LC network. In this manner, the slow-wave transmission line 92 is designed to transmit slow-wave signals at speeds compatible with tunable filters by forcing the slow-wave signal to travel a further distance, as well as by slowing down the slow-wave signal using the LC network.

Notably, impedance can vary within a slow-wave transmission line due to its structure. Thus, it may be desirable to better control the impedance within a slow-wave transmission line. In this manner, ground bars connected to corresponding ground structures may be disposed within and between loop structures of a slow-wave transmission line to help regulate the impedance throughout the structure.

Figure 8A:
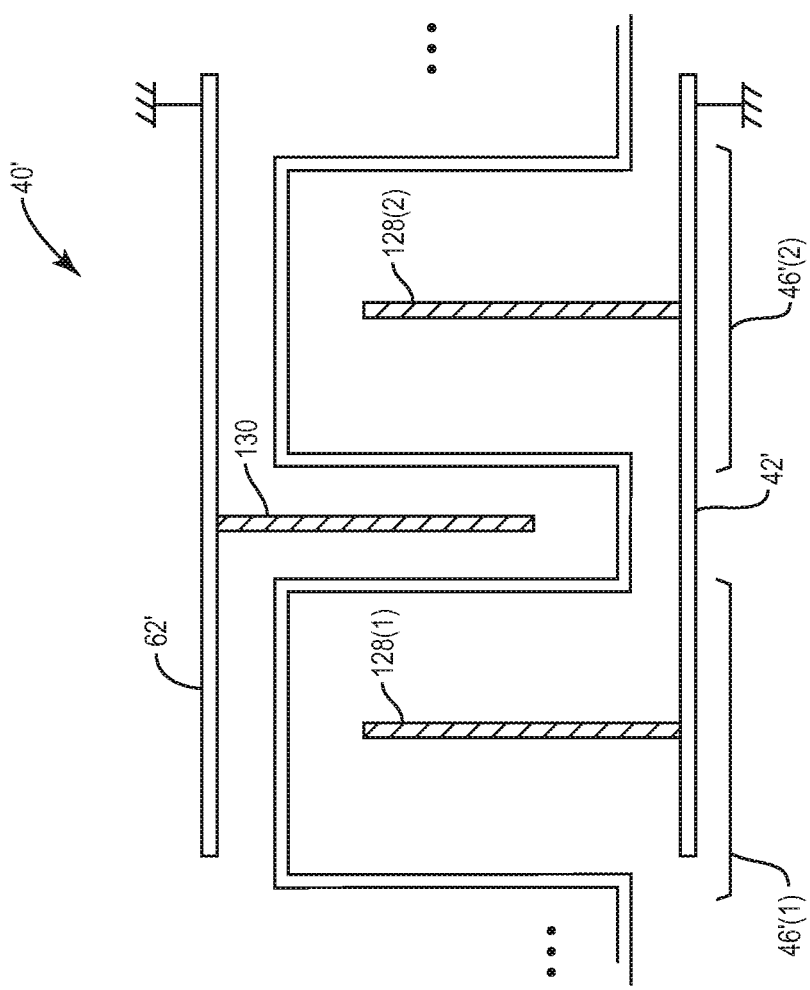
FIG. 8A is a diagram of an exemplary slow-wave transmission line with an undulating signal path, wherein the slow-wave transmission line is disposed in a U-shaped pattern and employs I-shaped ground bars.

FIG. 8A illustrates an exemplary U-shaped slow-wave transmission line 40' that employs certain common components with the slow-wave transmission line 40 in FIGS. 5A, 5B. Such common components that have an associated number "X" in FIGS. 5A, 5B are denoted by a number "X'" in FIG. 8A, and thus will not be re-described herein. In this manner, the slow-wave transmission line 40' includes loop structures 46'(1), 46'(2), as well as first and second ground structures 42', 62'. Further, the slow-wave transmission line 40' also employs I-shaped first ground bars 128(1), 128(2) connected to the first ground structure 42' and disposed within the loop structures 46'(1), 46'(2), respectively. The slow-wave transmission line 40' also includes an I-shaped second ground bar 130 connected to the second ground structure 62' and disposed between the loop structures 46'(1), 46'(2). By disposing the I-shaped first ground bars 128(1), 128(2) and the I-shaped second ground bar 130 in this manner, the impedance through the slow-wave transmission line 40' is more regulated.

Figure 8B:
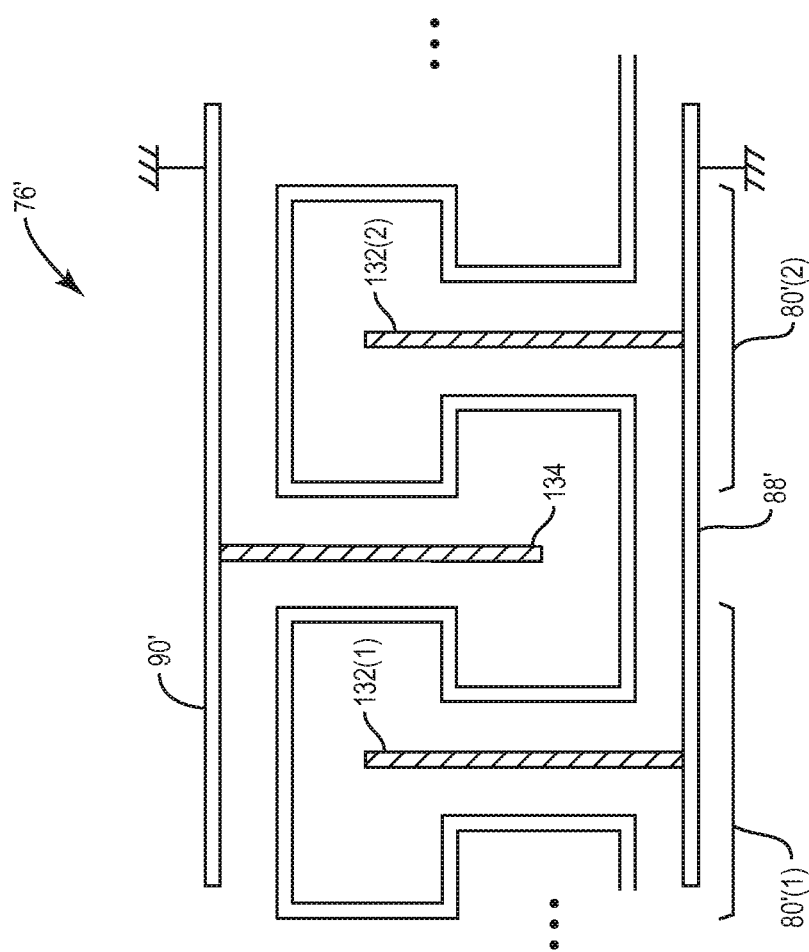
FIG. 8B is a diagram of an exemplary slow-wave transmission line with an undulating signal path, wherein the slow-wave transmission line is disposed in a T-shaped pattern and employs I-shaped ground bars.

Further, FIG. 8B illustrates an exemplary T-shaped slow-wave transmission line 76' that employs certain common components with the slow-wave transmission line 76 in FIG. 6A. Such common components that have an associated number "X" in FIG. 6A are denoted by a number "X'" in FIG. 8B, and thus will not be re-described herein. In this manner, the slow-wave transmission line 76' includes loop structures 80'(1), 80'(2), as well as first and second ground structures 88', 90'. Further, the slow-wave transmission line 76' also employs I-shaped first ground bars 132(1), 132(2) connected to the first ground structure 88' and disposed within the loop structures 80'(1), 80'(2), respectively. The slow-wave transmission line 76' also includes an I-shaped second ground bar 134 connected to the second ground structure 90' and disposed between the loop structures 80'(1), 80'(2). By disposing the I-shaped first ground bars 132(1), 132(2) and the I-shaped second ground bar 134 in this manner, the impedance through the slow-wave transmission line 76' is more regulated.

Figure 8C:
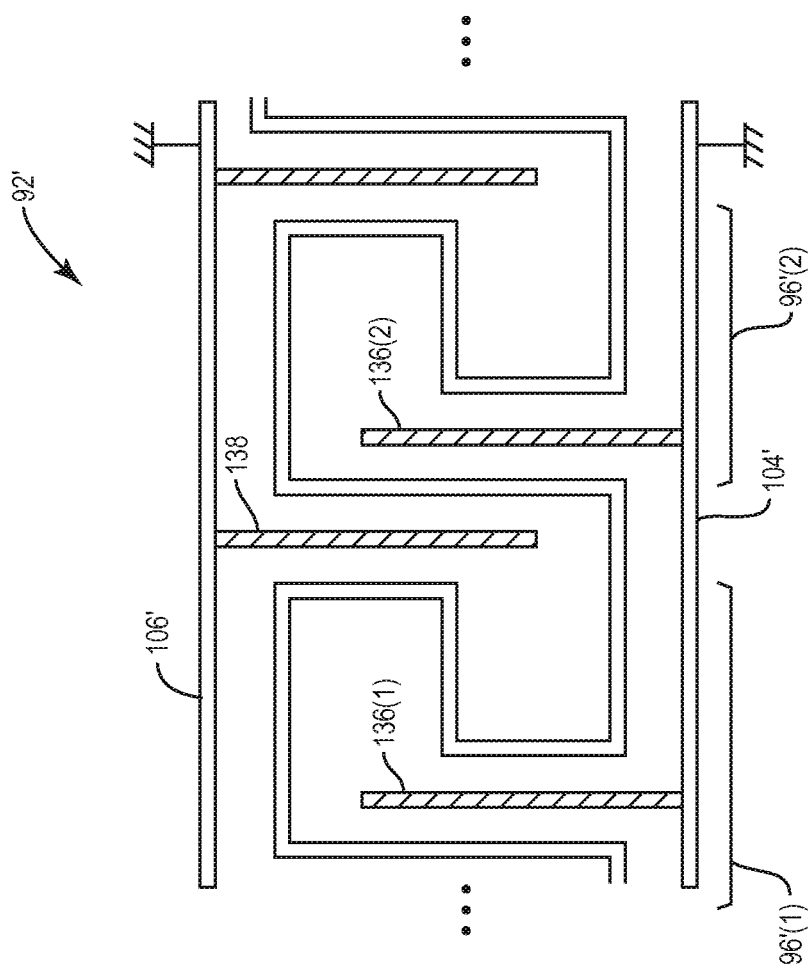
FIG. 8C is a diagram of an exemplary slow-wave transmission line with an undulating signal path, wherein the slow-wave transmission line is disposed in a P-shaped pattern and employs I-shaped ground bars.

Further, FIG. 8C illustrates an exemplary P-shaped slow-wave transmission line 92' that employs certain common components with the slow-wave transmission line 92 in FIG. 6B. Such common components that have an associated number "X" in FIG. 6B are denoted by a number "X'" in FIG. 8C, and thus will not be re-described herein. In this manner, the slow-wave transmission line 92' includes loop structures 96'(1), 96'(2), as well as first and second ground structures 104', 106'. Further, the slow-wave transmission line 92' also employs I-shaped first ground bars 136(1), 136(2) connected to the first ground structure 104' and disposed within the loop structures 96'(1), 96'(2), respectively. The slow-wave transmission line 92' also includes an I-shaped second ground bar 138 connected to the second ground structure 90' and disposed between the loop structures 96'(1), 96'(2). By disposing the 1-shaped first ground bars 136(1), 136(2) and the 1-shaped second ground bar 138 in this manner, the impedance through the slow-wave transmission line 92' is more regulated.

Notably, although the ground bars described in FIGS. 8A-8C are I-shaped ground bars, other embodiments may achieve similar function when employing ground bars with alternative shapes. In this manner, FIG. 8D illustrates an exemplary T-shaped slow-wave transmission line 76" that employs certain common components with the slow-wave transmission line 76' in FIG. 8B. Such common components that have an associated number "X'" in FIG. 8B are denoted by a number "X''" in FIG. 8D, and thus will not be re-described herein. The slow-wave transmission line 76" includes T-shaped first ground bars 140(1), 140(2) connected to the first ground structure 88" and disposed within the loop structures 80"(1), 80"(2), respectively. The slow-wave transmission line 76" also includes a T-shaped second ground bar 142 connected to the second ground structure 90" and disposed between the loop structures 80"(1), 80"(2).

Additionally, FIG. 8E illustrates an exemplary P-shaped slow-wave transmission line 92" that employs certain common components with the slow-wave transmission line 92' in FIG. 8C. Such common components that have an associated number "X'" in FIG. 8C are denoted by a number "X''" in FIG. 8E, and thus will not be re-described herein. The slow-wave transmission line 92" includes L-shaped first ground bars 144(1), 144(2) connected to the first ground structure 104" and disposed within the loop structures 96"(1), 96"(2), respectively. The slow-wave transmission line 92" also includes an L-shaped second ground bar 146 connected to the second ground structure 106" and disposed between the loop structures 96"(1), 96"(2).

Figure 9A:
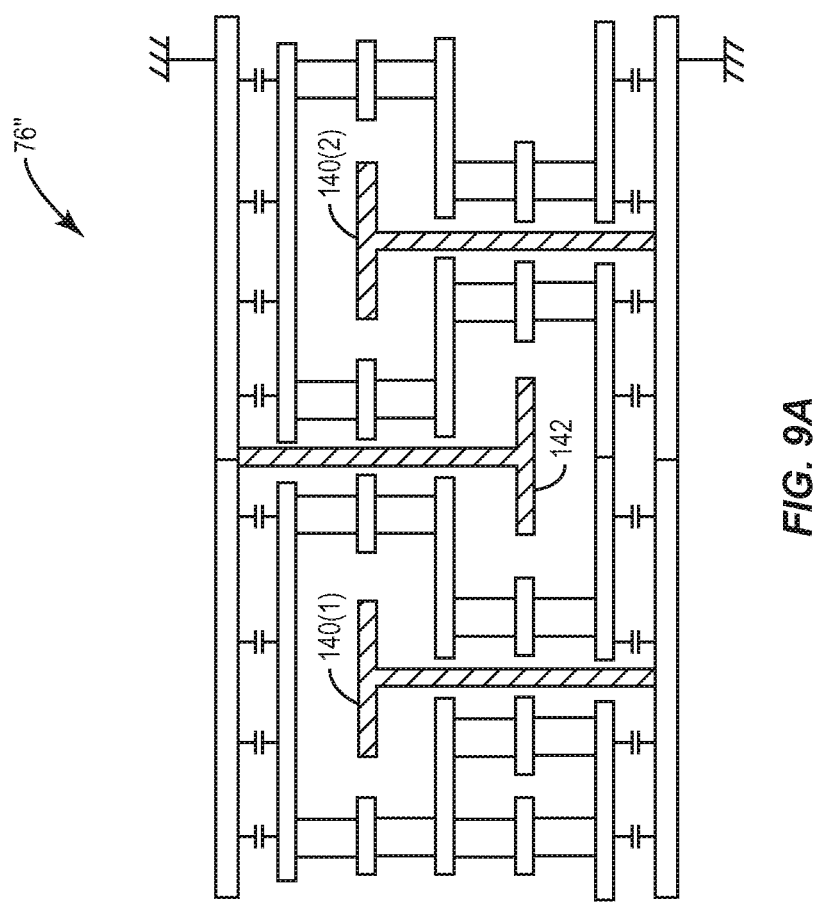
FIG. 9A is a cross-sectional diagram of the slow-wave transmission line disposed in the T-shaped pattern that employs the T-shaped ground bars.
Figure 9B:
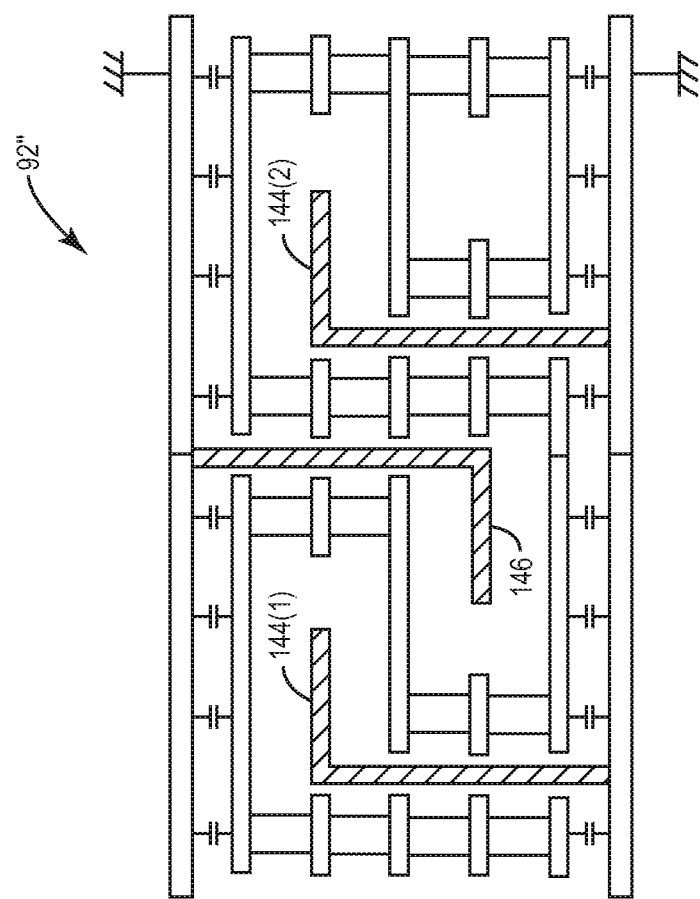
FIG. 9B is a cross-sectional diagram of the slow-wave transmission line disposed in the P-shaped pattern that employs the L-shaped ground bars.

To provide further illustration, FIG. 9A illustrates a cross-sectional diagram of the slow-wave transmission line 76" in FIG. 8D. The slow-wave transmission line 76" includes similar components as those described in reference to the slow-wave transmission line 76 in FIG. 7A, and thus will not be re-described herein. Notably, as previously described, the slow-wave transmission line 76" includes the T-shaped first ground bars 140(1), 140(2) and the T-shaped second ground bar 142. Further, FIG. 9B illustrates a cross-sectional diagram of the slow-wave transmission line 92" in FIG. 8E. The slow-wave transmission line 92" includes similar components as those described in reference to the slow-wave transmission line 92 in FIG. 7B, and thus will not be re-described herein. Notably, as previously described, the slow-wave transmission line 92" includes the L-shaped first ground bars 144(1), 144(2) and the L-shaped second ground bar 146.

Figure 10A:
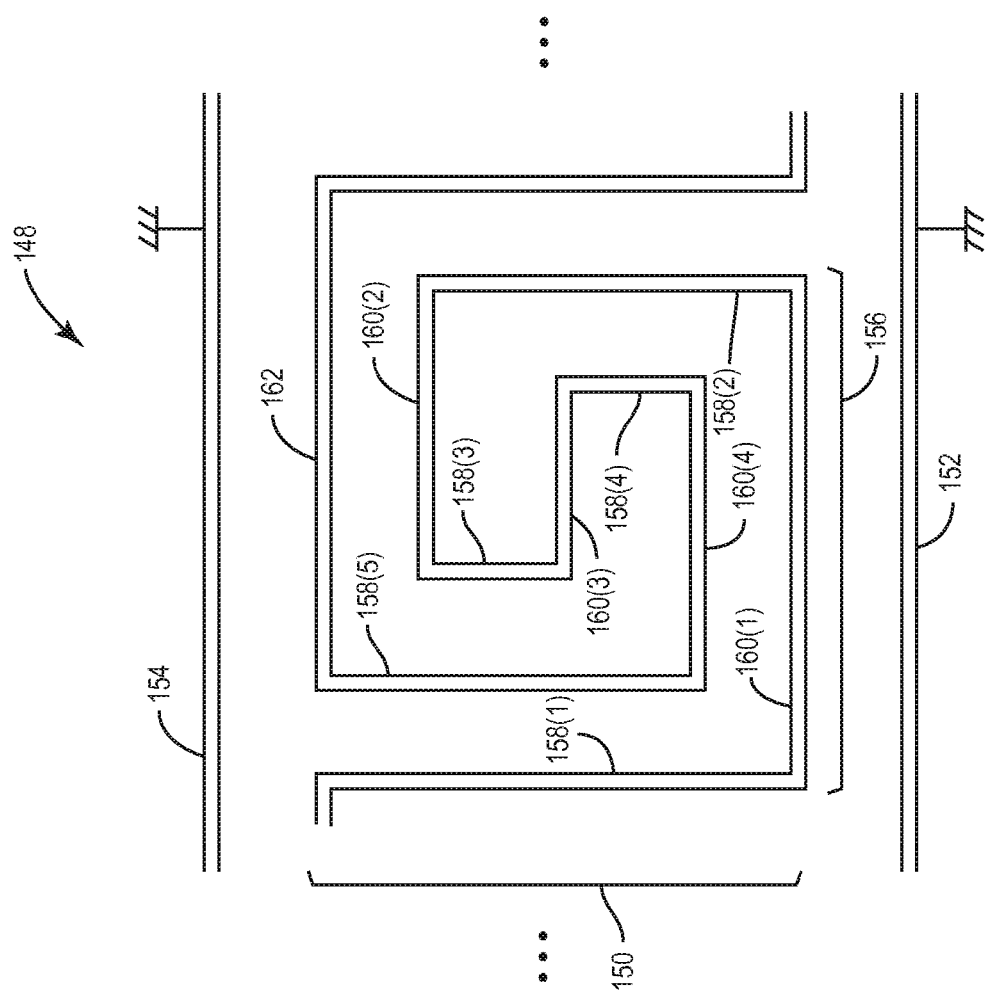
FIG. 10A is a diagram of an exemplary slow-wave transmission line with an undulating signal path, wherein the slow-wave transmission line is disposed in a double-L-shaped pattern.

In addition to the U-shaped, T-shaped, and P-shaped slow-wave transmission lines 40, 76, and 92 previously described, other embodiments may employ slow-wave transmission lines in alternative shapes. FIG. 10A illustrates an exemplary slow-wave transmission line 148 disposed in a double-L-shaped pattern (also referred to as a "double-P-shaped pattern"). The slow-wave transmission line 148 includes an undulating signal path 150, and a first and second ground structure 152, 154 disposed on opposite sides of the undulating signal path 150. Notably, although only one loop structure 156 is illustrated in FIG. 10A, the slow-wave transmission line 148 may employ multiple loop structures 156(1)-156(N).

The loop structure 156 employs via structures 158(1)-158(5) connected by intra-loop traces 160(1)-160(4). In this manner, the via structures 158(1), 158(2) are connected by the intra-loop trace 160(1), and the via structures 158(2), 158(3) are connected by the intra-loop trace 160(2). Further, the via structures 158(3), 158(4) are connected by the intra-loop trace 160(3), and the via structures 158(4), 158(5) are connected by the intra-loop trace 160(4). Additionally, an inter-loop trace 162 is employed to connect the loop structure 156 to an adjacent loop structure (not shown).

Figure 10B:
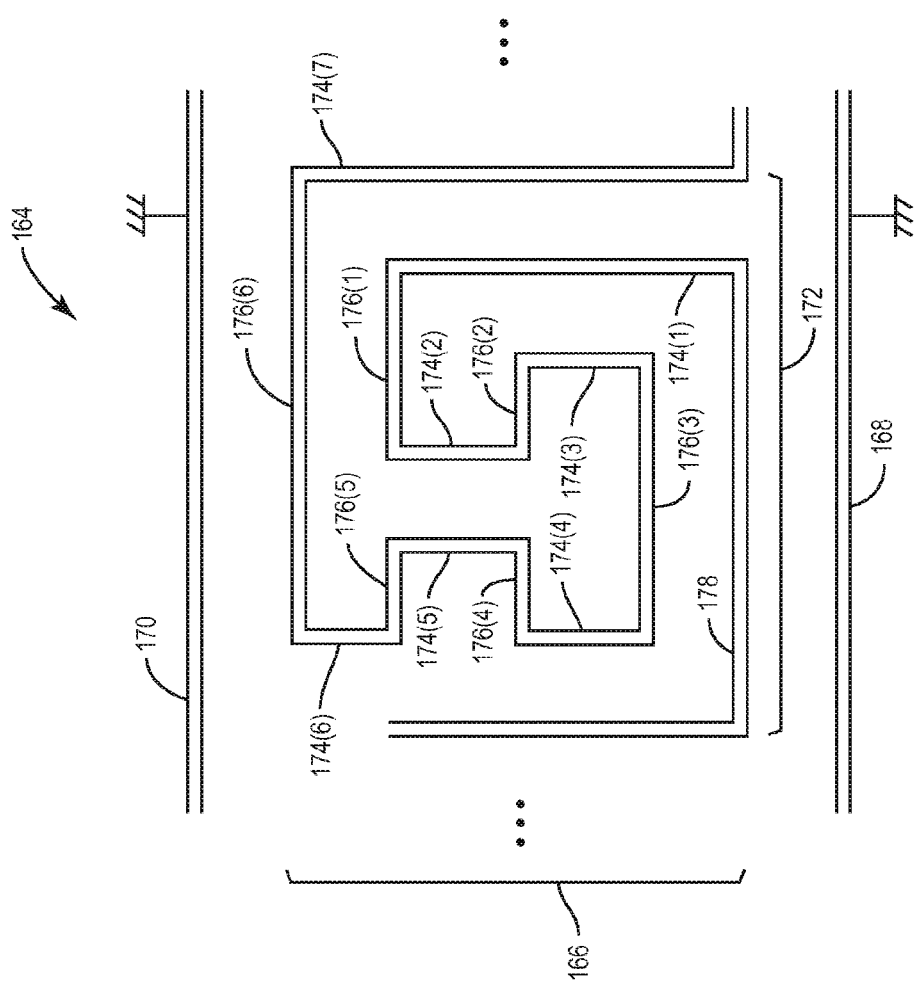
FIG. 10B is a diagram of an exemplary slow-wave transmission line with an undulating signal path, wherein the slow-wave transmission line is disposed in a double-T-shaped pattern.

FIG. 10B illustrates an exemplary slow-wave transmission line 164 disposed in a double-T-shaped pattern. The slow-wave transmission line 164 includes an undulating signal path 166, and a first and second ground structure 168, 170 disposed on opposite sides of the undulating signal path 166. Notably, although only one loop structure 172 is illustrated in FIG. 10B, the slow-wave transmission line 164 may employ multiple loop structures 172(1)-172(N).

Further, the loop structure 172 employs via structures 174(1)-174(7) connected by intra-loop traces 176(1)-176(6). In this manner, the via structures 174(1), 174(2) are connected by the intra-loop trace 176(1), and the via structures 174(2), 174(3) are connected by the intra-loop trace 176(2). Further, the via structures 174(3), 174(4) are connected by the intra-loop trace 176(3), and the via structures 174(4), 174(5) are connected by the intra-loop trace 176(4). The via structures 174(5), 174(6) are connected by the intra-loop trace 176(5), and the via structures 174(6), 174(7) are connected by the intra-loop trace 176(6). Additionally, an inter-loop trace 178 is employed to connect the loop structure 172 to adjacent loop structures (not shown).

Figure 10C:
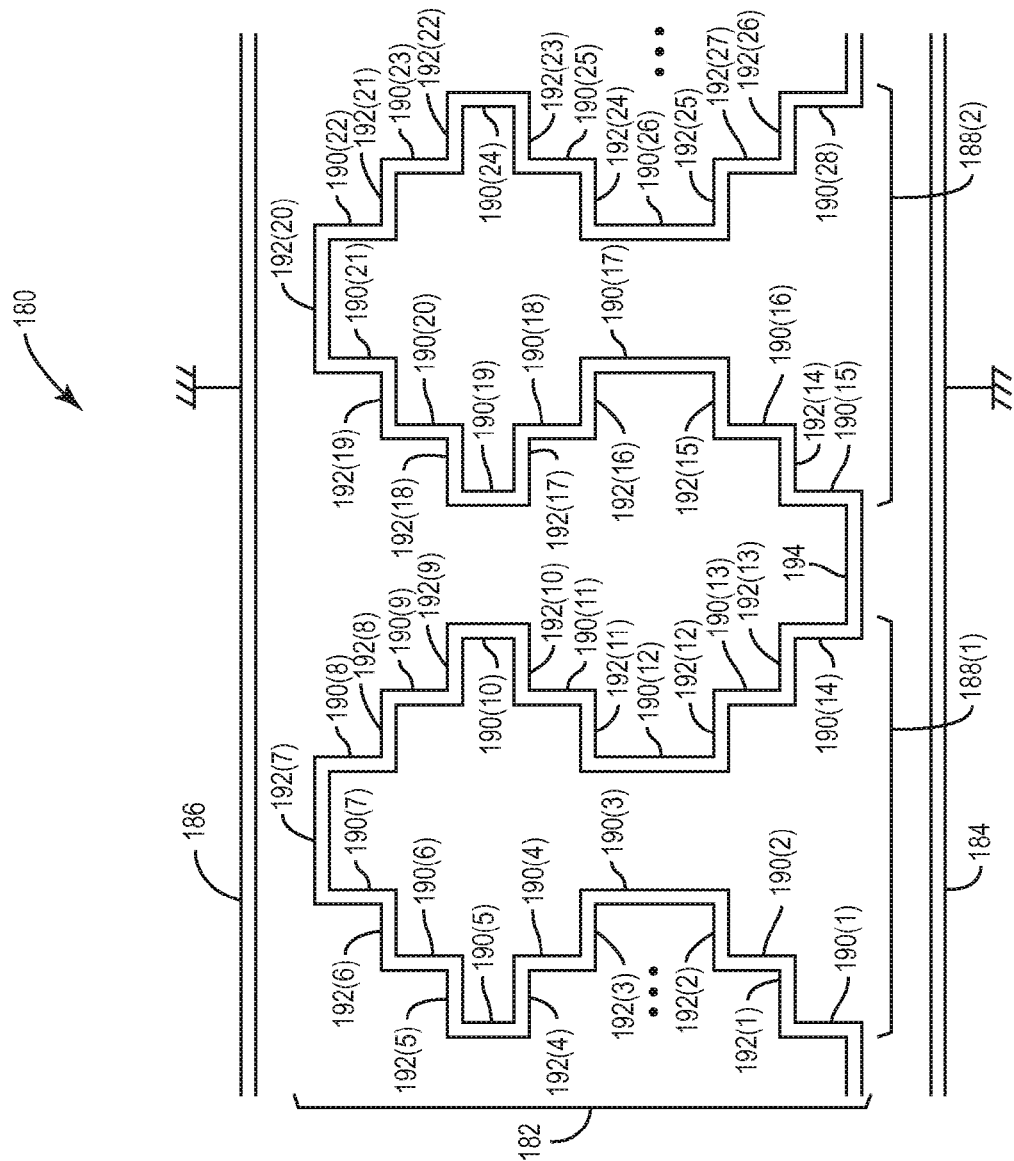
FIG. 10C is a diagram of an exemplary slow-wave transmission line with an undulating signal path, wherein the slow-wave transmission line is disposed in a polygonal-shaped pattern.

FIG. 10C illustrates an exemplary slow-wave transmission line 180 disposed in a polygonal-shaped pattern. The slow-wave transmission line 180 includes an undulating signal path 182, and a first and second ground structure 184, 186 disposed on opposite sides of the undulating signal path 182. Notably, although only two loop structures 188(1), 188(2) are illustrated in FIG. 10C, the slow-wave transmission line 180 may employ multiple loop structures 188(1)-188(N).

Further, the loop structure 188(1) employs via structures 190(1)-190(14) connected by intra-loop traces 192(1)-192(13). In this manner, the via structures 190(1), 190(2) are connected by the intra-loop trace 192(1), and the via structures 190(2), 190(3) are connected by the intra-loop trace 192(2). Further, the via structures 190(3), 190(4) are connected by the intra-loop trace 192(3), and the via structures 190(4), 190(5) are connected by the intra-loop trace 192(4). The via structures 190(5), 190(6) are connected by the intra-loop trace 192(5), and the via structures 190(6), 190(7) are connected by the intra-loop trace 192(6). The via structures 190(7), 190(8) are connected by the intra-loop trace 192(7), and the via structures 190(8), 190(9) are connected by the intra-loop trace 192(8). The via structures 190(9), 190(10) are connected by the intra-loop trace 192(9), and the via structures 190(10), 190(11) are connected by the intra-loop trace 192(10). The via structures 190(11), 190(12) are connected by the intra-loop trace 192(11), and the via structures 190(12), 190(13) are connected by the intra-loop trace 192(12). The via structures 190(13), 190(14) are connected by the intra-loop trace 192(13). Additionally, an inter-loop trace 194 is employed to connect the loop structures 188(1), 188(2).

Additionally, the loop structure 188(2) employs via structures 190(15)-190(28) connected by intra-loop traces 192(14)-192(26). In this manner the via structures 190(15), 190(16) are connected by the intra-loop trace 192(14), and the via structures 190(16), 190(17) are connected by the intra-loop trace 192(15). Further, the via structures 190(17), 190(18) are connected by the intra-loop trace 192(16), and the via structures 190(18), 190(19) are connected by the intra-loop trace 192(17). The via structures 190(19), 190(20) are connected by the intra-loop trace 192(18), and the via structures 190(20), 190(21) are connected by the intra-loop trace 192(19). The via structures 190(21), 190(22) are connected by the intra-loop trace 192(20), and the via structures 190(22), 190(23) are connected by the intra-loop trace 192(21). The via structures 190(23), 190(24) are connected by the intra-loop trace 192(22), and the via structures 190(24), 190(25) are connected by the intra-loop trace 192(23). The via structures 190(25), 190(26) are connected by the intra-loop trace 192(24), and the via structures 190(26), 190(27) are connected by the intra-loop trace 192(25). The via structures 190(27), 190(28) are connected by the intra-loop trace 192(26).

Figure 10D:
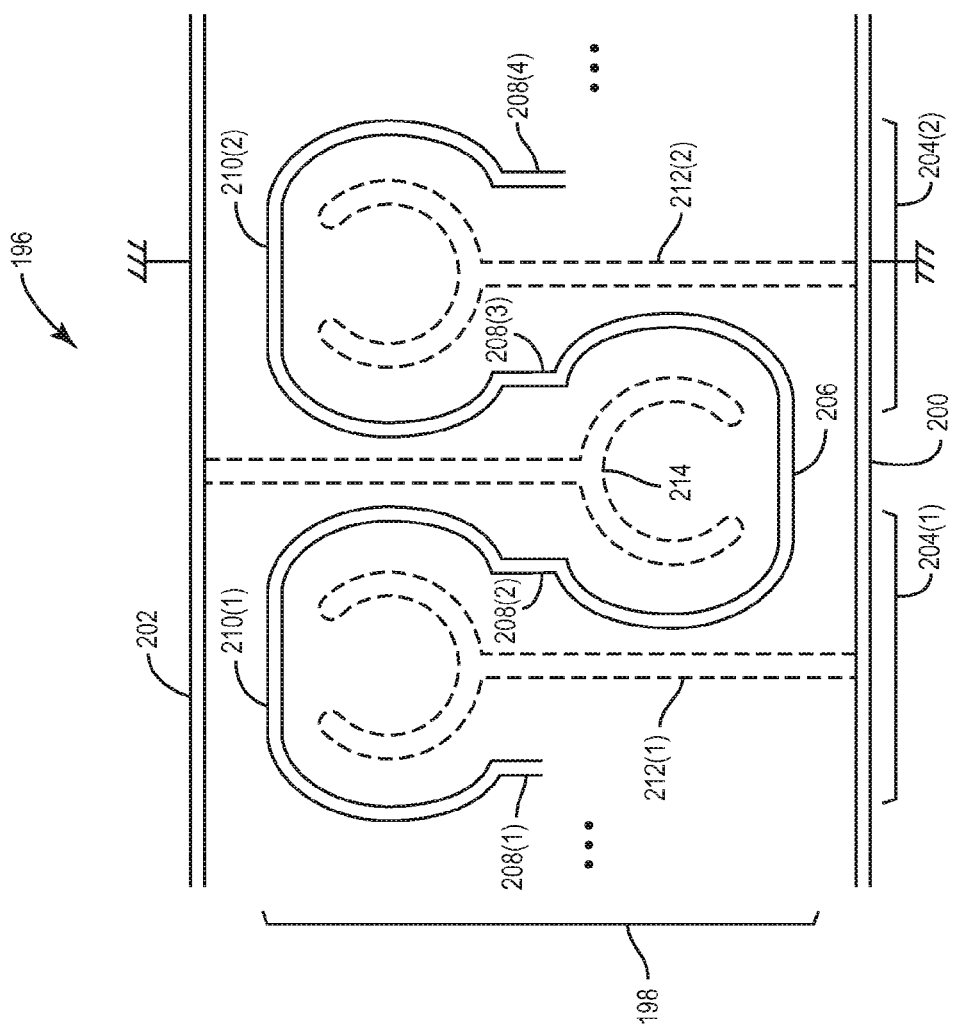
FIG. 10D is a diagram of an exemplary slow-wave transmission line with an undulating signal path, wherein the slow-wave transmission line is disposed in a rounded pattern.

FIG. 10D illustrates an exemplary slow-wave transmission line 196 disposed in a rounded pattern. The slow-wave transmission line 196 includes an undulating signal path 198, and a first and second ground structure 200, 202 disposed on opposite sides of the undulating signal path 198. Loop structures 204(1), 204(2) are disposed adjacent to one another and connected by an inter-loop trace 206, thus forming a rounded pattern between the loop structures 204(1), 204(2). The loop structure 204(1) includes via structures 208(1), 208(2) connected by an intra-loop trace 210(1). Similarly, the loop structure 204(2) includes via structures 208(3), 208(4) connected by an intra-loop trace 210(2). Notably, to help regulate the impedance within the slow-wave transmission line 196 as previously described, first ground bars 212(1), 212(2) connected to the first ground structure 200 are disposed within the loop structures 204(1), 204(2), respectively. A second ground bar 214 connected to the second ground structure 202 is disposed between the loop structures 204(1), 204(2).

Therefore, the slow-wave transmission lines 148, 164, 180, and 196 in FIGS. 10A-10D, respectively, are designed to transmit slow-wave signals at speeds compatible with tunable filters by forcing the slow-wave signal to travel a further distance, as well as by slowing down the slow-wave signal using corresponding LC networks (not shown).

In addition to forming an LC network within a slow-wave transmission line as previously described, shielding may be disposed around a slow-wave transmission line so as to form an LC network along an entire undulating signal path. In this manner, FIG. 11 illustrates an exemplary slow-wave transmission line 216 employing a shield structure 218 along an undulating signal path 220. The slow-wave transmission line 216 includes loop structures 222(1)-222(3). The loop structure 222(1) includes two via structures 224(1), 224(2) connected by an intra-loop trace 226(1). Similarly, the loop structure 222(2) includes via structures 224(3), 224(4) connected by an intra-loop trace 226(2), while the loop structure 222(3) includes via structures 224(5), 224(6) connected by an intra-loop trace 226(3). The slow-wave transmission line 216 also employs inter-loop traces 228(1), 228(2) that connect loop structures 222(1), 222(2) and 222(2), 222(3), respectively.

Further, the shield structure 218 is formed so that each shield section 230(1)-230(6) provides shielding around each corresponding via structure 224(1)-224(6). Thus, the shield section 230(1) provides shielding for the via structure 224(1), the shield section 230(2) provides shielding for the via structure 224(2), and the shield section 230(3) provides shielding for the via structure 224(3). Additionally, the shield section 230(4) provides shielding for the via structure 224(4), the shield section 230(5) provides shielding for the via structure 224(5), and the shield section 230(6) provides shielding for the via structure 224(6). By providing the shielding in this manner, the shield structure 218 forms an LC network along the undulating signal path 220 that reduces the speed of a transmitted slow-wave signal in the slow-wave transmission line 216.

Figure 12:
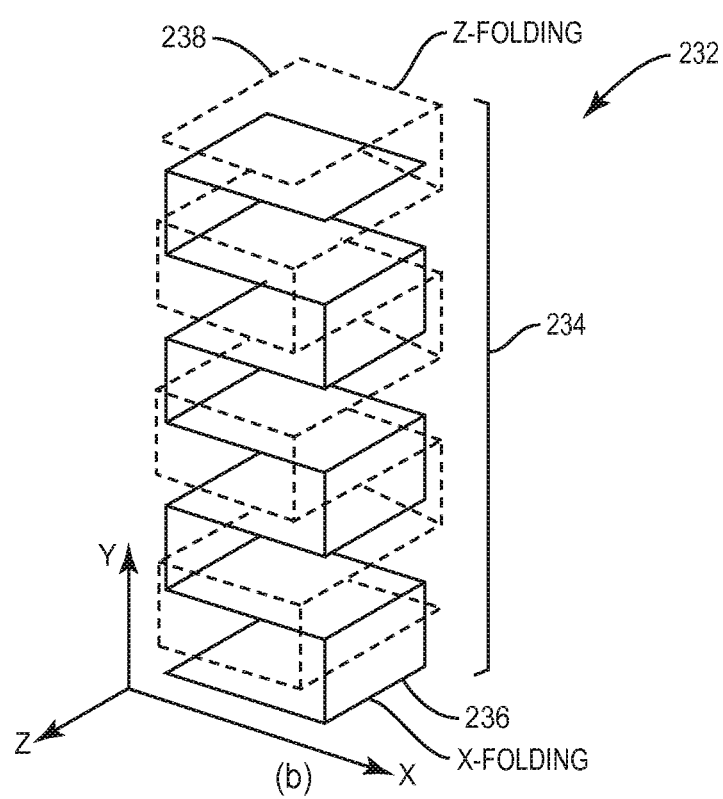
FIG. 12 is a diagram of an exemplary double-folded slow-wave transmission line with an undulating signal path.

In addition to via structures and traces as described above, slow-wave transmission lines disclosed herein may also be formed using metal bands. FIG. 12 illustrates an exemplary double-folded slow-wave transmission line 232 having an undulating signal path 234. The double-folded slow-wave transmission line 232 includes a metal band 236 that is folded in a U-shaped pattern with alternating turns along an X-axis (e.g., X-folding). The metal band 236 is constructed of a conductive material that is adapted to propagate a transmitted slow-wave signal. The double-folded slow-wave transmission line 232 also includes a ground band 238 that is folded in a U-shaped pattern with alternating turns along a Z-axis (e.g., Z-folding). The metal band 236 is disposed 90 degrees counter-clockwise relative to the ground band 238. Further, the metal band 236 is interlaced with the ground band 238 so that the folds of the metal band 236 alternate with the folds of the ground band 238. Interlacing of the metal band 236 and the ground band 238 causes an LC network to form within the double-folded slow-wave transmission line 232. Thus, the double-folded slow-wave transmission line 232 is designed to transmit slow-wave signals at speeds compatible with tunable filters by forcing the slow-wave signal to travel a further distance, as well as by slowing down the slow-wave signal using the LC network.

Figure 13:
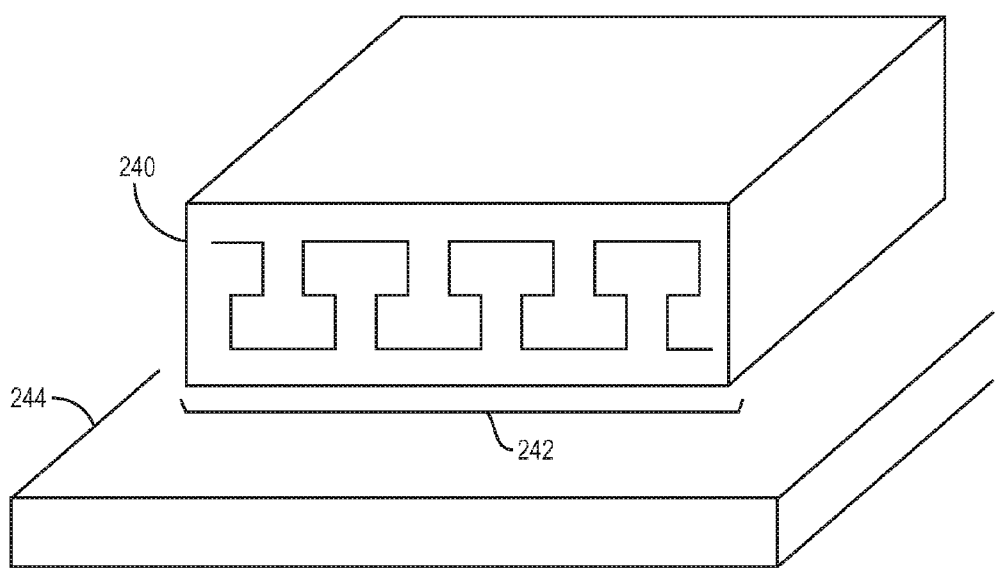
FIG. 13 is a diagram of an exemplary slow-wave transmission line with an undulating signal path employed as a discrete device mounted on a PCB.

Notably, slow-wave transmission lines with undulating signal paths as disclosed herein may be fabricated as discrete devices and mounted onto other devices. FIG. 13 illustrates an exemplary slow-wave transmission line 240 with an undulating signal path 242, wherein the slow-wave transmission line 240 is employed as a discrete surface-mounted device. In this manner, the slow-wave transmission line 240 is mounted to a PCB 244. Further, in some embodiments, an integrated circuit (IC) die may be stacked on top of a slow-wave transmission line, which may increase the overall height of a device. Alternatively, an IC die may be embedded within the layers of a slow-wave transmission line to retain a lower profile with reduced height. Connections between a slow-wave transmission line and such IC die may be realized vertically or horizontally.

Figure 14A:
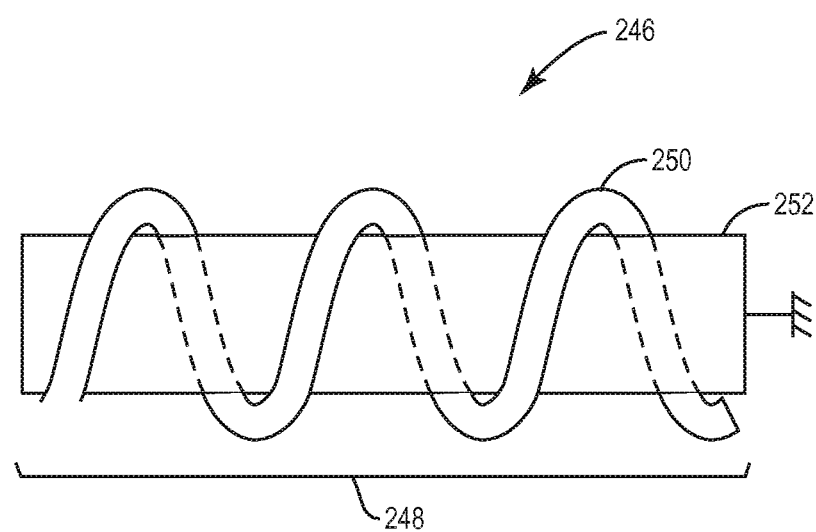
FIG. 14A is a diagram of an exemplary solenoid-type slow-wave transmission line with an undulating signal path disposed around a ground structure.
Figure 14B:
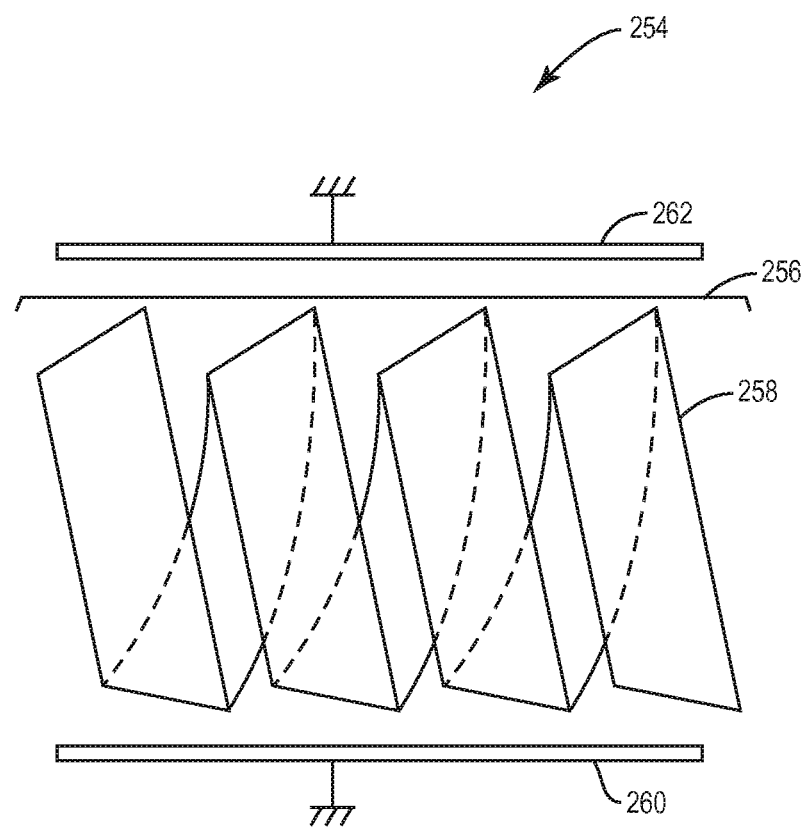
FIG. 14B is a diagram of an exemplary solenoid-type slow-wave transmission line with an undulating signal path disposed between a first and second ground structure.

Notably, slow-wave transmission lines as disclosed herein may also be employed using a wire in a solenoid-type fashion. FIG. 14A illustrates an exemplary solenoid-type slow-wave transmission line 246 with an undulating signal path 248. The solenoid-type slow-wave transmission line 246 includes a conductive wire 250 disposed around a ground structure 252. Further, FIG. 14B illustrates an exemplary solenoid-type slow-wave transmission line 254 with an undulating signal path 256. The solenoid-type slow-wave transmission line 254 includes a conductive wire 258 disposed between a first ground structure 260 and a second ground structure 262. The solenoid-type slow-wave transmission lines 246, 254 are designed to transmit slow-wave signals at speeds compatible with tunable filters by forcing the slow-wave signal to travel a further distance, as well as by slowing down the slow-wave signal using an LC network.

In addition to the embodiments described above, slow-wave transmission lines may also be formed using both semiconductor and multi-layer laminate processes so as to include a high permittivity material and/or a high permeability material to further reduce speeds of transmitted waves.

Notably, a high permittivity material is defined herein as a material that has a relative permittivity $\in(r)$ greater than or equal to 10 at 2.5 GHz, room temperature, and 50% humidity, wherein $\in(r)=\in/\in(0)$, $\in(0)$ is the permittivity of free space ($\in(0)=8.85\times10E-12$ F/m), and $\in$ is the absolute permittivity of the material. Relative permittivity $\in(r)$ is also referred to as the dielectric constant. In select embodiments, relative permittivity $\in(r)$ of the high permittivity material may have an upper bound of 100, 1,000, and 10,000, respectively.

Further, a high permeability material is defined herein as a material that has a relative permeability $\mu(r)$ greater than or equal to 2 at 2.5 GHz, room temperature, and 50% humidity, wherein $\mu(r)=\mu/\mu(0)$, $\mu(0)$ is the permeability of free space ($\mu(0)=4\pi\times10E-7$ F/m), and $\mu$ is the absolute permeability of the material. In select embodiments, relative permeability $\mu(r)$ of the high permeability material may have an upper bound of 1,000, 10,000, and 100,000, respectively.

Figure 15A:
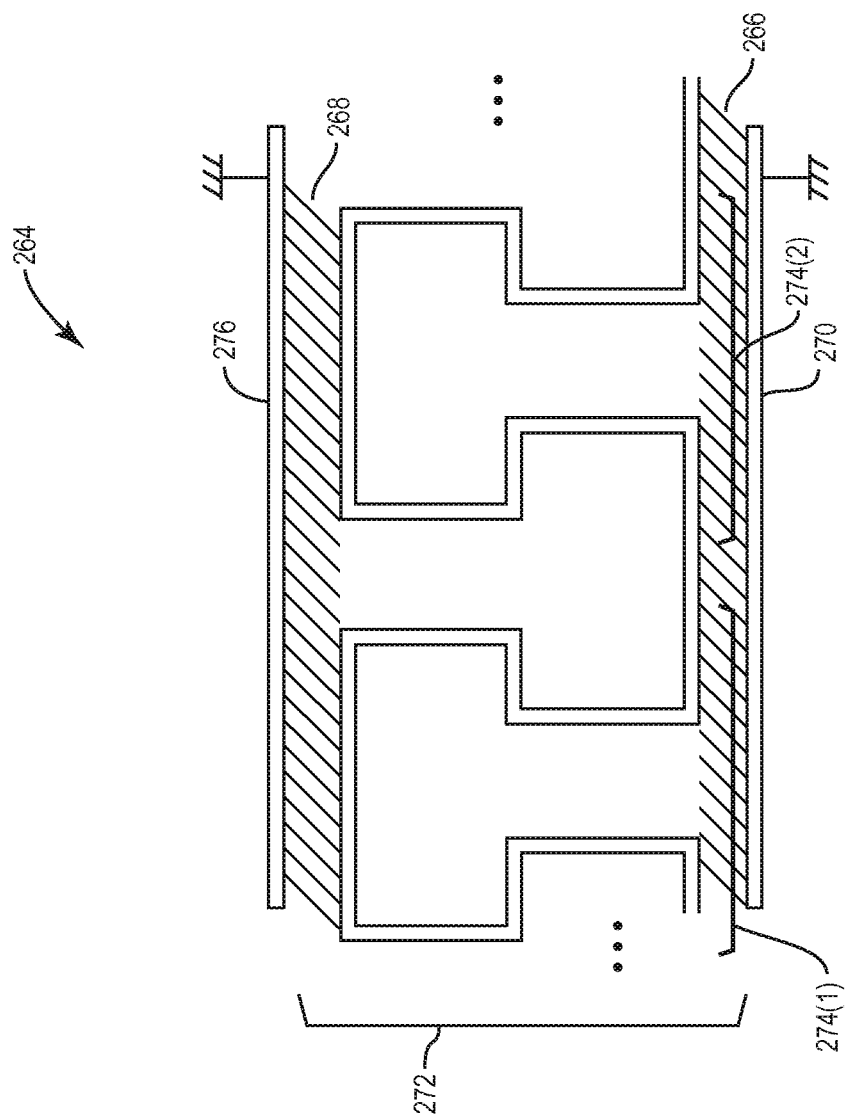
FIG. 15A is a diagram of an exemplary slow-wave transmission line with an undulating signal path, wherein the slow-wave transmission line includes insulator layers formed from a high permittivity material.

For example, FIG. 15A illustrates an exemplary slow-wave transmission line 264 similar to the slow-wave transmission line 76 described in FIG. 6A. However, the slow-wave transmission line 264 includes a first insulator layer 266 and a second insulator layer 268 made from a higher permittivity material. Notably, the first insulator layer 266 is formed between a first ground structure 270 and an undulating signal path 272 that includes loop structures 274(1), 274(2). The second insulator layer 268 is formed between a second ground structure 276 and the undulating signal path 272. Forming the first and second insulator layers 266, 268 in this manner increases the capacitive component of the slow-wave transmission line 264. Further, because the speed at which a wave signal is transmitted (the velocity factor (Vf) (not shown)) by the slow-wave transmission line 264 is inversely proportional to the square root of the relative permittivity ($Vf=1/\sqrt{\in(r)}$), the high permittivity material of the first and second insulator layers 266, 268 further reduces the speed of transmitted waves.

Additionally, FIG. 15B illustrates an exemplary slow-wave transmission line 278 similar to the slow-wave transmission line 76 described in FIG. 6A. However, the slow-wave transmission line 278 includes a first insulator layer 280, a second insulator layer 282, and a third insulator layer 284 made from a high permeability material. Notably, the first insulator layer 280 is formed within an interior cavity of loop structure 286(1), while the second insulator layer 282 is formed within an interior cavity of loop structure 286(2). Further, the third insulator layer 284 is formed between the loop structures 286(1), 286(2). Forming the first, second, and third insulator layers 280, 282, 284 in this manner increases the inductive component of the slow-wave transmission line 278. Further, because the speed at which a wave signal is transmitted (the velocity factor (Vf) (not shown)) by the slow-wave transmission line 278 is inversely proportional to the square root of the relative permeability ($\mu(r)$) ($Vf=1/\sqrt{\mu(r)}$), the permeability ($\mu$) of the first, second, and third insulator layers 280, 282, and 284 further reduces the speed of transmitted waves.

Further, the slow-wave transmission lines as disclosed herein may be implemented using processes other than laminate technology. As non-limiting examples, the slow-wave transmission lines may be implemented using three-dimensional (3-D) printing, spraying, or metal bending.

Figure 16A:
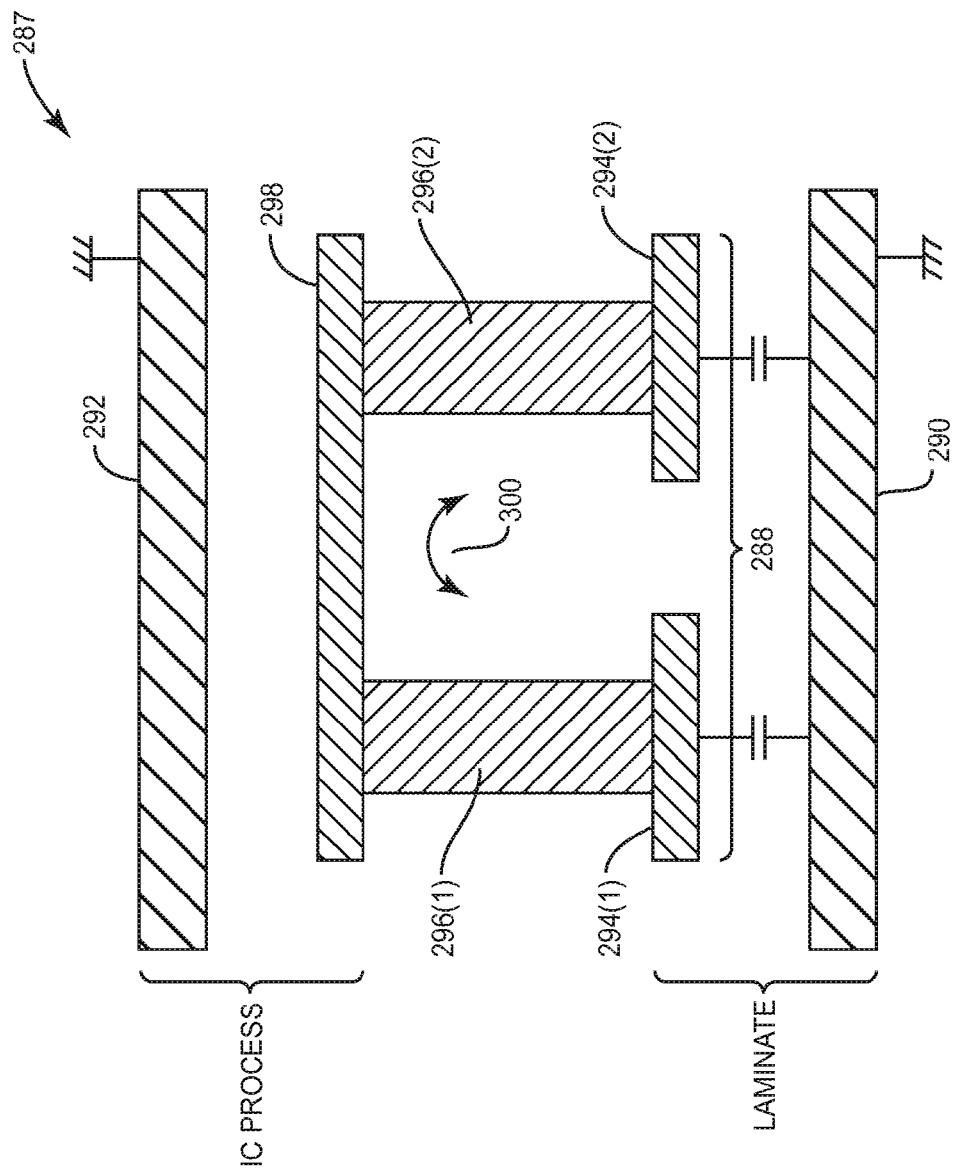
FIG. 16A is a diagram of an exemplary slow-wave transmission line with an undulating signal path formed using integrated circuit (IC) and laminate processes.

In this manner, slow-wave transmissions lines as described herein may be implemented using a combination of IC and multi-layer laminate processes. Notably, such an IC process includes multiple metal layers, wherein one or more metal layers may have a relatively high thickness. For example, FIG. 16A illustrates a portion of a slow-wave transmission line 287 employed using IC and laminate processes. The slow-wave transmission line 287 includes a loop structure 288 formed between first and second ground structures 290, 292. The first ground structure 290 and inter-loop traces 294(1), 294(2) are formed using laminate. Further, via structures 296(1), 296(2) are formed using copper pillars, while an intra-loop trace 298 and the second ground structure 292 are formed from thick metal layers using the IC process. Using the copper pillars and the thick metal layers in this manner helps to realize an inductance 300 of the slow-wave transmission line 287.

Figure 16B:
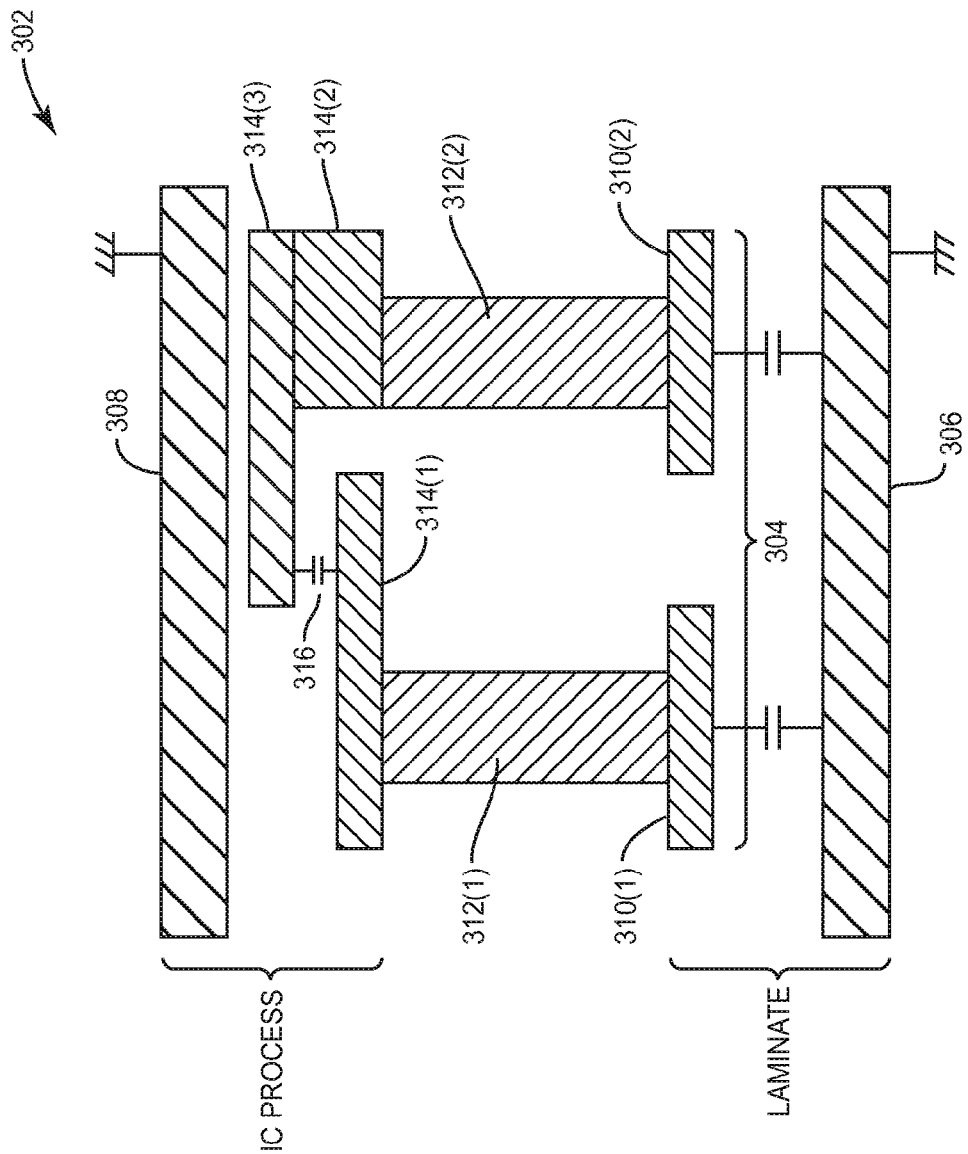
FIG. 16B is a diagram of an exemplary slow-wave transmission line with an undulating signal path formed using IC and laminate processes.

Further, FIG. 16B illustrates a portion of another slow-wave transmission line 302 employed using IC and laminate processes. The slow-wave transmission line 302 includes a loop structure 304 formed between first and second ground structures 306, 308. The first ground structure 306 and inter-loop traces 310(1), 310(2) are formed using laminate. Further, via structures 312(1), 312(2) are formed using copper pillars. Intra-loop traces 314(1), 314(2), 314(3) and the second ground structure 308 are formed from thick metal layers using the IC process. Using the copper pillars and the thick metal layers in this manner help to realize a capacitance 316 of the slow-wave transmission line 302.

Notably, metal capture pads between consecutive vias may have a certain overhang or may be coincident with the via footprint (i.e., a zero capture pad). Alternatively, the via and the metal capture pads may have a certain offset, or the metal capture pads may not be present.

In addition to the embodiments described above, elements may be employed to tune the slow-wave transmission lines such that signals transmitted by the slow-wave transmission lines are transmitted with a particular frequency. Notably, tuning conventional LC circuits achieves a tuning range (TR) that is a function of a frequency (f) of the transmitted signal, a quality factor (Q) of the LC circuit, and a figure of merit (FOM) of the tuning element. Notably, the figure of merit (FOM) is calculated according to FOM=Ron*Coff, wherein Ron is the on-state resistance of the tuning element and Coff is the off-state capacitance of the tuning element. In this manner, the tuning range (TR) of conventional LC circuits is calculated using the following equation: TR=$\sqrt{(1+(1/(2\pi f^*FOM^*Q)))}$. As can be seen from this equation, a higher required quality factor (Q) and/or a high value figure of merit (FOM) reduces the tuning range (TR) (e.g., a lower figure of merit (FOM) is needed for improved performance). Thus, achieving a higher tuning range (TR) using conventional transmission lines results in either a lower quality factor (Q) or requires a low value figure of merit (FOM). However, the tunable slow-wave transmission lines described herein may be tuned so as to achieve a higher tuning range (TR), while also achieving a higher quality factor (Q) while using moderate figure of merit (FOM) tuning elements.

Figure 17A:
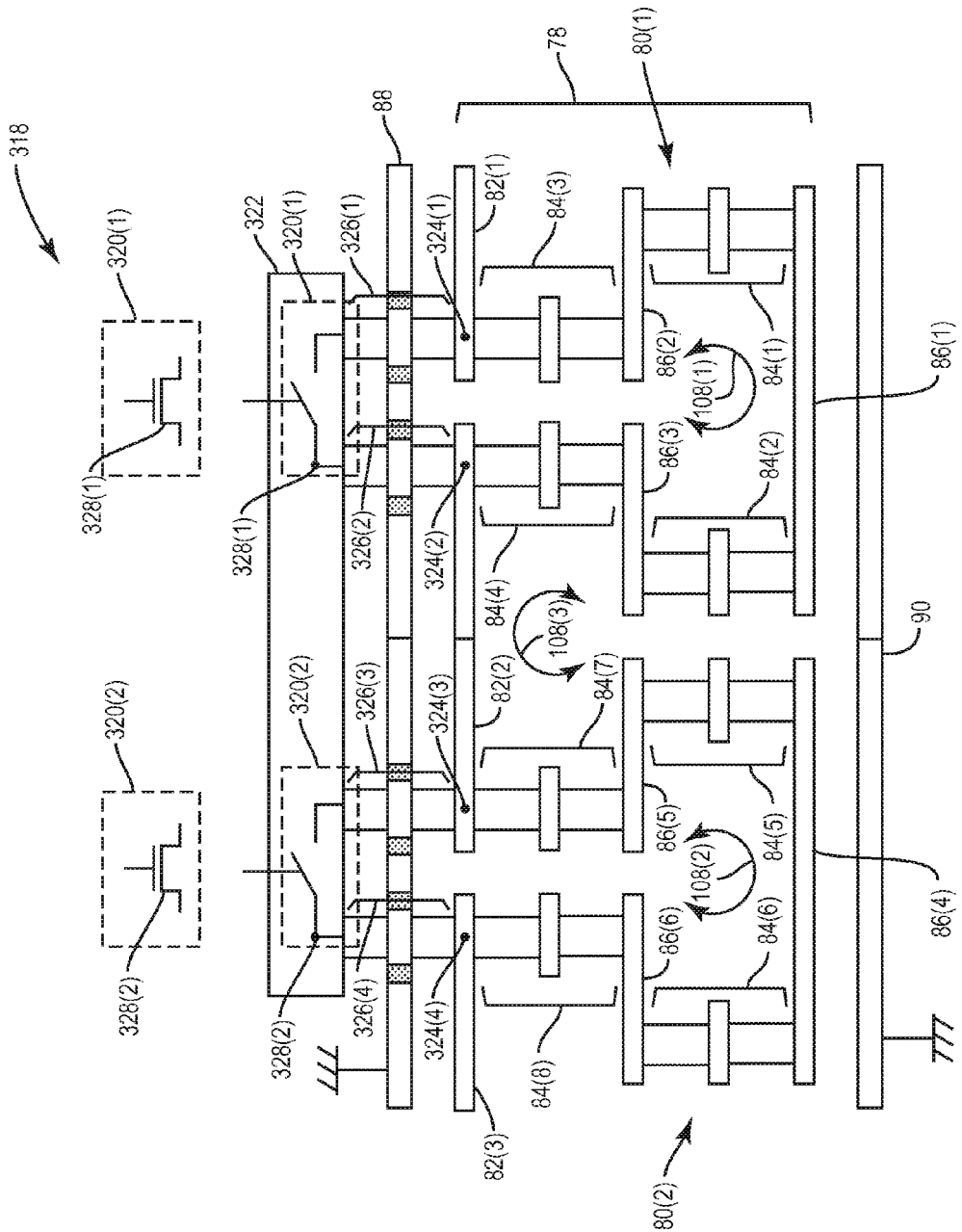
FIG. 17A is a cross-sectional diagram of an exemplary tunable slow-wave transmission line, wherein the tunable slow-wave transmission line includes switches coupled in parallel with corresponding loop structures.
Figure 17B:
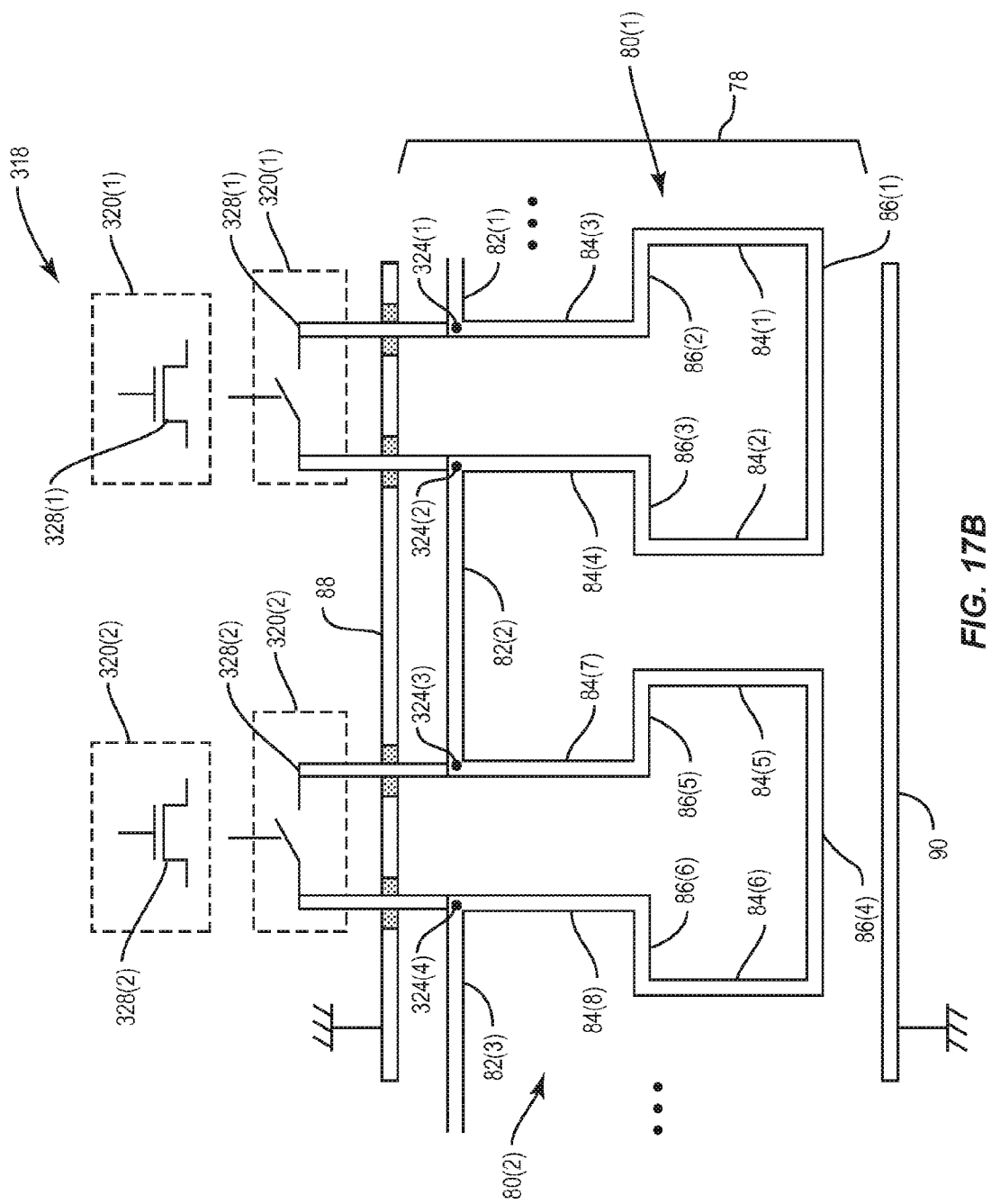
FIG. 17B is another diagram of the tunable slow-wave transmission line in FIG. 17A.

For example, FIG. 17A illustrates a cross-sectional diagram of an exemplary tunable slow-wave transmission line 318 similar to the slow-wave transmission line 76 in FIG. 7A. Notably, a block diagram representation of the tunable slow-wave transmission line 318 is illustrated in FIG. 17B.

Unlike the slow-wave transmission line 76 in FIG. 7A, the tunable slow-wave transmission line 318 in FIG. 17A includes a first circuit 320(1) coupled in parallel with the loop structure 80(1) (also referred to herein as a first loop structure 80(1)), and a second circuit 320(2) coupled in parallel with the loop structure 80(2) (also referred to herein as a second loop structure 80(2)). In this embodiment, the first and second circuits 320(1), 320(2) are employed in a silicon-on-insulator (SOI) structure 322. To couple the first circuit 320(1) in parallel with the first loop structure 80(1), the first circuit 320(1) is coupled to the undulating signal path 78 at a first location 324(1) on an inter-loop trace 82(1) and a second location 324(2) on an inter-loop trace 82(2). The first loop structure 80(1) extends between the first and second locations 324(1), 324(2). Similarly, to couple the second circuit 320(2) in parallel with the second loop structure 80(2), the second circuit 320(2) is coupled to the undulating signal path 78 at a third location 324(3) on the inter-loop trace 82(2) and a fourth location 324(4) on an inter-loop trace 82(3). The second loop structure 80(2) extends between the third and fourth locations 324(3), 324(4). In this manner, the first circuit 320(1) is not in parallel with the second loop structure 80(2), and the second circuit 320(2) is not in parallel with the first loop structure 80(1).

Further, the first circuit 320(1) is coupled to the first location 324(1) using a via structure 326(1), and is coupled to the second location 324(2) using a via structure 326(2). Notably, gaps (illustrated as shaded regions adjacent to the first ground structure 88) are formed to prevent the via structure 326(1) from coupling to the first ground structure 88, and to prevent the via structure 326(1) from coupling to the first ground structure 88. The second circuit 320(2) is coupled to the third location 324(3) using a via structure 326(3), and is coupled to the fourth location 324(4) using a via structure 326(4). Notably, gaps are formed to prevent the via structure 326(3) from coupling to the first ground structure 88, and to prevent the via structure 326(4) from coupling to the first ground structure 88.

Additionally, the first circuit 320(1) includes an electronic component 328(1) that is in parallel with the first loop structure 80(1). Similarly, the second circuit 320(2) includes an electronic component 328(2) that is in parallel with the second loop structure 80(2). Notably, although this embodiment employs switches for the electronic components 328(1), 328(2) (also referred to herein as switches 328(1), 328(2)), other embodiments may employ transistors for the electronic components 328(1), 328(2).

In this manner, activation of the switch 328(1) and/or the switch 328(2) may tune the frequency of a signal transmitted by the tunable slow-wave transmission line 318. For example, activation of the switch 328(1) causes a signal to be transmitted through the first circuit 320(1) instead of the first loop structure 80(1), because the first circuit 320(1) offers a path of least resistance (e.g., impedance) as compared to the path of the first loop structure 80(1). As a result, the signal transmitted through the first circuit 320(1) avoids the distributed LC network of the first loop structure 80(1). Thus, the signal transmitted through the first circuit 320(1) does not experience the reduction in speed associated with the distributed LC network of the first loop structure 80(1) (e.g., of that portion of the undulating signal path 78), which in turn tunes the frequency of the signal transmitted by the tunable slow-wave transmission line 318. Notably, the switch 328(1) provides low impedance, and thus, a signal traverses the switch 328(1) with low loss when the switch 328(1) is activated. As such, switch-based tuning as described above achieves discrete values of frequency. Activation of the switch 328(2) may provide additional tuning of the signal for reasons similar to those described in relation to the switch 328(1). Further, because the switches 328(1), 328(2) do not cause large voltage swings in the transmitted signal, a higher tuning range (TR) may be achieved without a lower quality factor (Q) or figure of merit (FOM). Notably, since the effective length of a slow-wave transmission line, such as the slow-wave transmission line 318, that implements a slow-wave propagation signal can be tuned over a wide range (e.g., over several octaves), the corresponding frequency of the signal may also be adjusted over a wide range.

Figure 18A:
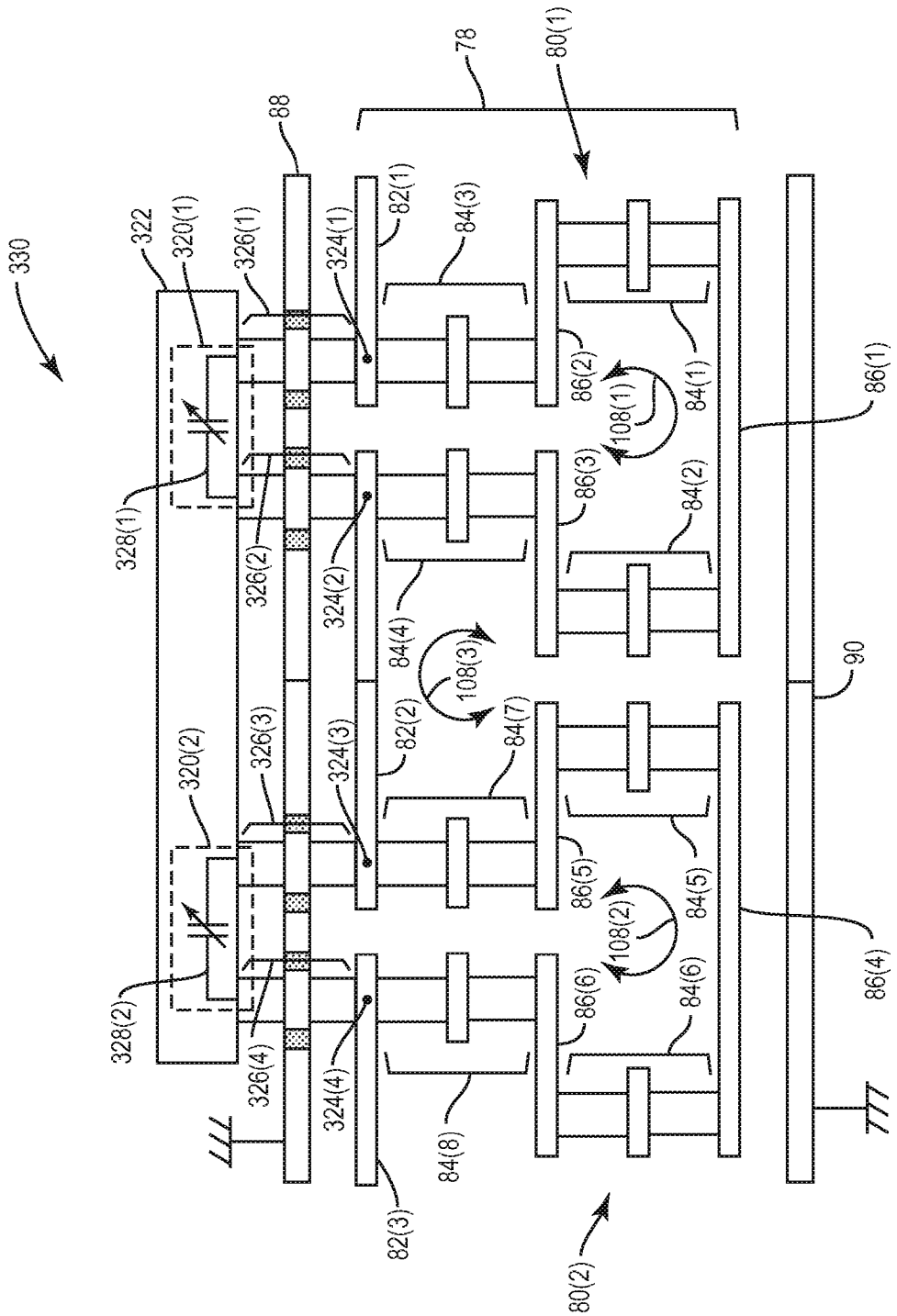
FIG. 18A is a cross-sectional diagram of an exemplary tunable slow-wave transmission line, wherein the tunable slow-wave transmission line includes variable capacitors coupled in parallel with corresponding loop structures.
Figure 18B:
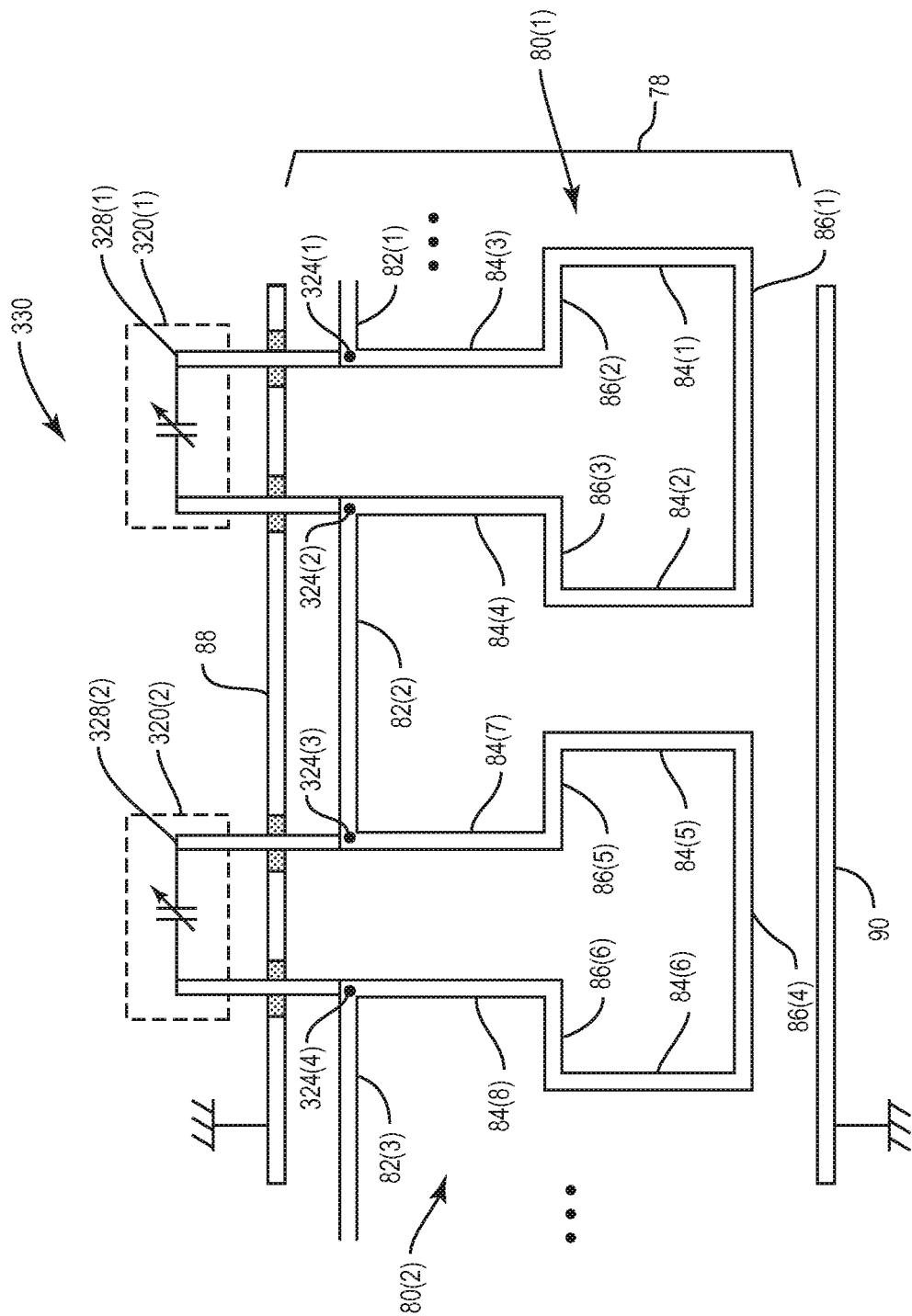
FIG. 18B is another diagram of the tunable slow-wave transmission line in FIG. 18A.

FIG. 18A illustrates a cross-sectional diagram of an exemplary tunable slow-wave transmission line 330 similar to the tunable slow-wave transmission line 318 in FIG. 17A. However, rather than employing switches or transistors for the electronic components 328(1), 328(2) in the first and second circuits 320(1), 320(2), respectively, the tunable slow-wave transmission line 330 employs variable capacitors for the electronic components 328(1), 328(2) (also referred to herein as variable capacitors 328(1), 328(2)). Notably, in other embodiments, non-variable capacitors (i.e., capacitors) may be employed for the electronic components 328(1), 328(2). Additionally, other embodiments may include other elements for the electronic components 328(1), 328(2), including but not limited to, analog controlled varactors, digitally controlled varactors, discrete stepped switched capacitors, and microelectromechanical system (MEMS) switched capacitors. Further, a block diagram representation of the tunable slow-wave transmission line 330 is illustrated in FIG. 18B.

In this manner, the variable capacitors 328(1), 328(2) may be used to tune the frequency of a signal transmitted by the tunable slow-wave transmission line 330. For example, the variable capacitor 328(1) may be set to a capacitance that causes a signal to be transmitted through the first circuit 320(1) instead of through the first loop structure 80(1). As a result, the signal transmitted through the first circuit 320(1) avoids the LC network of the first loop structure 80(1). Thus, the signal transmitted through the first circuit 320(1) does not experience the reduction in speed associated with the LC network of the first loop structure 80(1), which in turn tunes the frequency of the signal transmitted by the tunable slow-wave transmission line 330. The variable capacitor 328(2) may provide additional tuning of the signal for reasons similar to those described in relation to the electronic component 328(1). Notably, the variable capacitors 328(1), 328(2) result in variable impedance such that the current is split between the variable capacitors 328(1), 328(2) and the first and second loop structures 80(1), 80(2). Such an effect leads to finer and/or continuous tuning.

Figure 19:
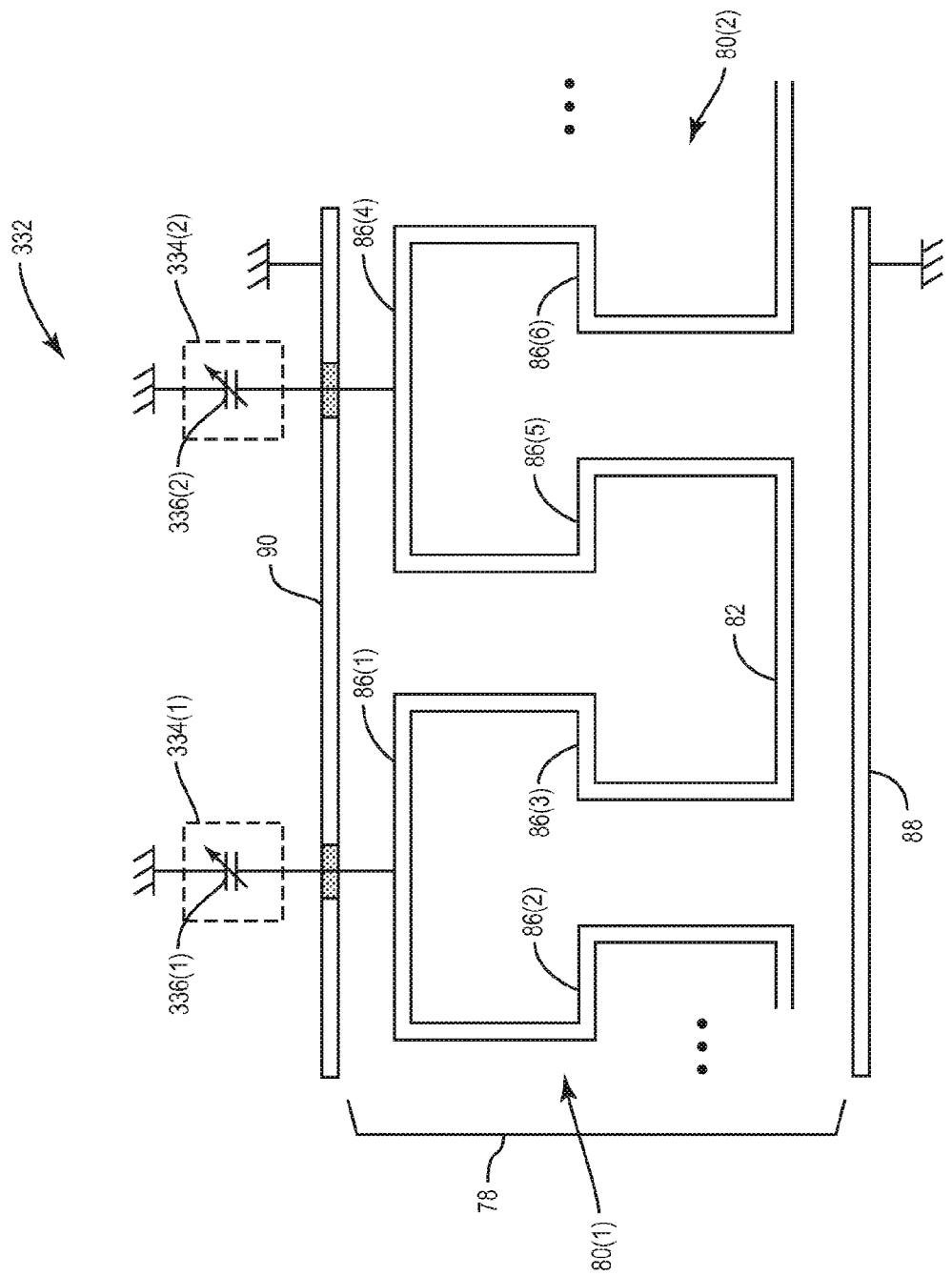
FIG. 19 is a diagram of an exemplary tunable slow-wave transmission line, wherein the tunable slow-wave transmission line includes variable capacitors coupled to corresponding intra-loop traces.

FIG. 19 illustrates a cross-sectional diagram of an exemplary tunable slow-wave transmission line 332 similar to the slow-wave transmission line 76 in FIG. 6A. However, unlike the slow-wave transmission line 76 in FIG. 6A, the tunable slow-wave transmission line 332 in FIG. 19 includes a first circuit 334(1) coupled to an intra-loop trace 86(1) of the first loop structure 80(1), and a second circuit 334(2) coupled to an intra-loop trace 86(4) of the second loop structure 80(2). Additionally, the first circuit 334(1) includes an electronic component 336(1), while the second circuit 334(2) includes an electronic component 336(2). In this embodiment, variable capacitors that are coupled to ground are employed for the electronic components 336(1), 336(2) (also referred to herein as variable capacitors 336(1), 336(2)). Notably, in other embodiments, non-variable capacitors (i.e., capacitors) may be employed for the electronic components 336(1), 336(2).

In this manner, the variable capacitors 336(1), 336(2) may be used to tune the frequency of a signal transmitted by the tunable slow-wave transmission line 332. For example, the variable capacitor 336(1) may be set to a capacitance such that a path traveled by a signal transmitted by the tunable slow-wave transmission line 332 includes a capacitance in addition to the capacitance of the distributed LC network of the first loop structure 80(1). Such an increase in capacitance reduces the speed of the transmitted signal, which in turn tunes the frequency of the signal transmitted by the tunable slow-wave transmission line 332. Further, parallel and series tunable capacitances change the effective length of the slow-wave transmission line 332 (e.g., effectively lengthens or shortens the distance a signal travels), and thus, changes a corresponding resonance frequency. The variable capacitor 336(2) may provide additional tuning of the signal for reasons similar to those described in relation to the variable capacitor 336(1).

Figure 20A:
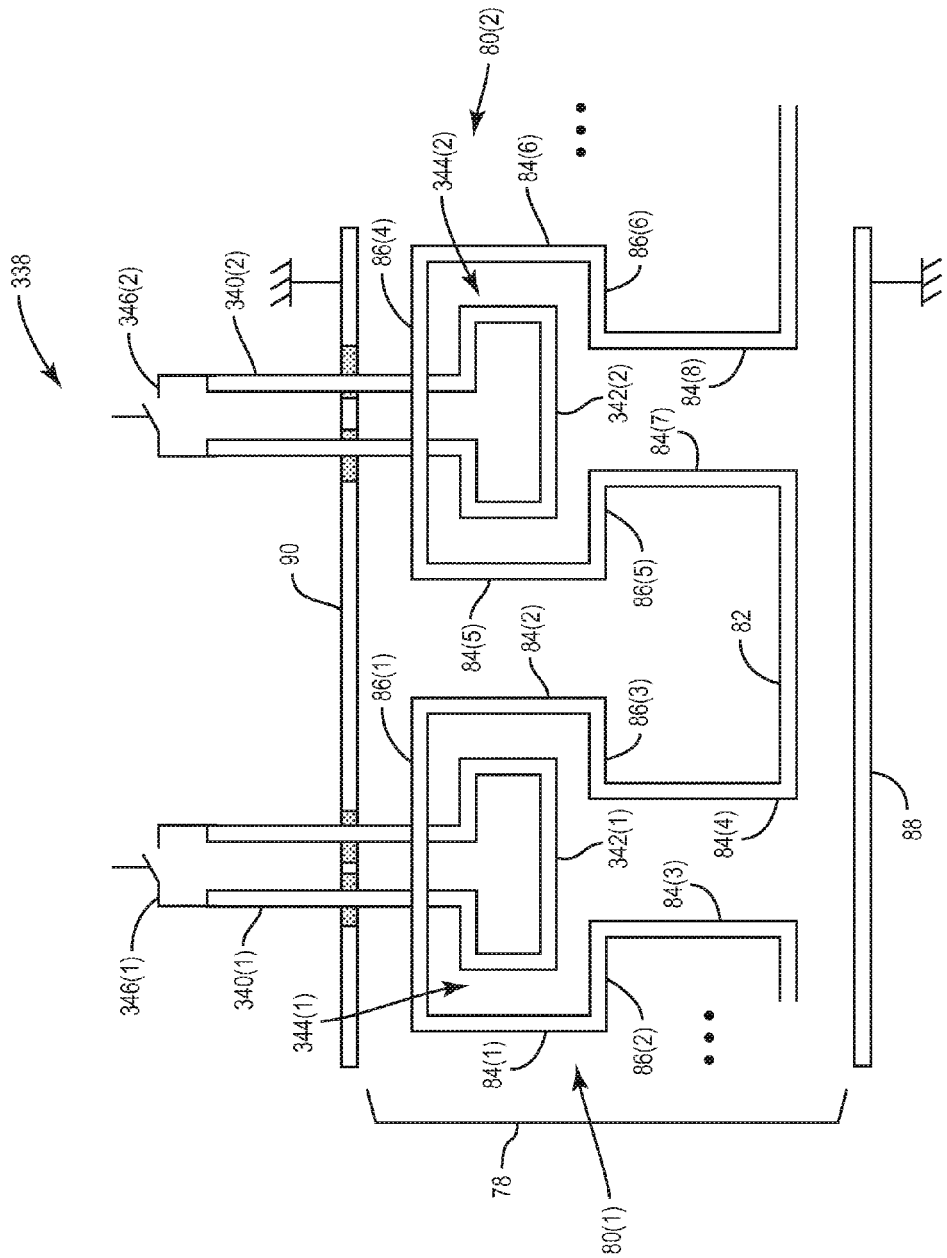
FIG. 20A is a diagram of an exemplary tunable slow-wave transmission line, wherein the tunable slow-wave transmission line includes floating loop structures residing within corresponding loop structures.

In addition to coupling circuits to slow-wave transmission lines as previously described, slow-wave transmission lines may be tunable by magnetically influencing a transmitted signal. In this manner, FIG. 20A illustrates an exemplary tunable slow-wave transmission line 338 similar to the slow-wave transmission line 76 in FIG. 6A. However, the tunable slow-wave transmission line 338 includes first and second floating loop structures 340(1), 340(2) configured to tune the frequency of a transmitted signal. A portion 342(1) of the first floating loop structure 340(1) resides within a space 344(1) of the first loop structure 80(1), and a portion 342(2) of the second floating loop structure 340(2) resides within a space 344(2) of the second loop structure 80(2). Notably, the first floating loop structure 340(1) is electrically isolated from the first loop structure 80(1), and the second floating loop structure 340(2) is electrically isolated from the second loop structure 80(2). Notably, the first and second floating loop structures 340(1), 340(2) are also electrically isolated from the second ground structure 90 by gaps illustrated as shaded regions adjacent to the second ground structure 90. Further, a series element 346(1) is included in the first floating loop structure 340(1), and a series element 346(2) is included in the second floating loop structure 340(2). In this embodiment, each series element 346(1), 346(2) is a switch (also referred to herein as switches 346(1), 346(2)), such that the switches 346(1), 346(2) may control whether a current flows through the first and second floating loop structures 340(1), 340(2), respectively.

For example, activation of the switch 346(1) causes the first floating loop structure 340(1) to form a closed loop circuit in which current may flow. When a signal is transmitted through the tunable slow-wave transmission line 338, a current flows along the undulating signal path 78. The current flowing along the undulating signal path 78 induces a corresponding magnetic field along the undulating signal path 78. Further, the magnetic field induced along the undulating signal path 78 induces a current to flow in the first floating loop structure 340(1) when the switch 346(1) is activated such that the induced current has a closed circuit in which to flow. The induced current flowing in the first floating loop structure 340(1) induces a magnetic field corresponding to the first floating loop structure 340(1). As a result, the induced magnetic field corresponding to the first floating loop structure 340(1) may affect the frequency of the signal transmitted in the tunable slow-wave transmission line 338. The extent to which the frequency of the transmitted signal is affected is based on the strength and directionality of the induced magnetic field corresponding to the first floating loop structure 340(1). In other words, when the switches 346(1), 346(2) are off, current does not flow into the first and second floating loop structures 340(1), 340(2), and thus, the first and second floating loop structures 340(1), 340(2) are effectively invisible to the slow-wave transmission line 338. When the switches 346(1), 346(2) are on, current flows and the mutual magnetic coupling between the first and second floating loop structures 340(1), 340(2), and the slow-wave transmission line 338 changes the equivalent inductance, and thus, the frequency. Notably, activation of the switch 346(2) may provide additional tuning of the signal for reasons similar to those described in relation to the switch 346(1).

Figure 20B:
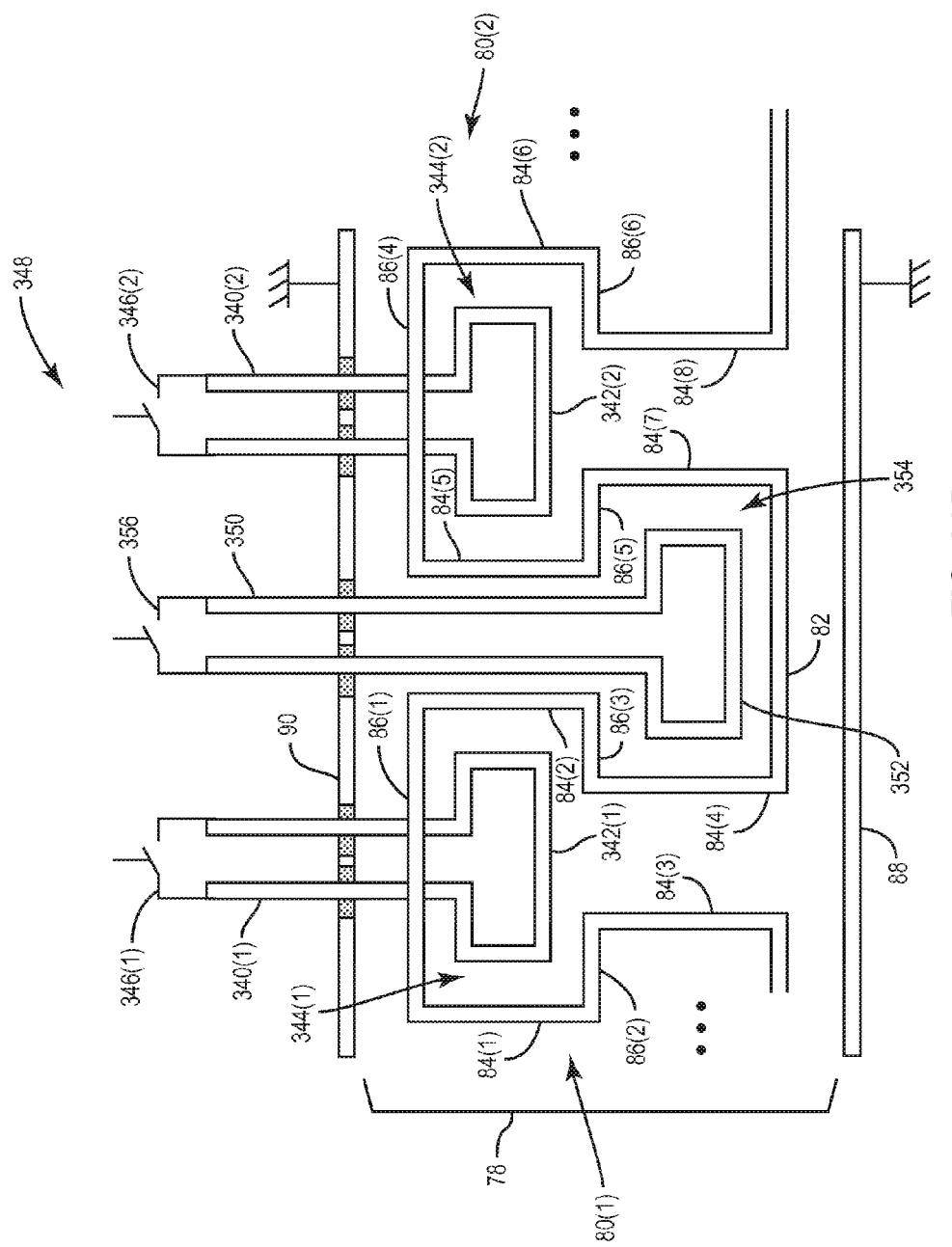
FIG. 20B is a diagram of an exemplary tunable slow-wave transmission line, wherein the tunable slow-wave transmission line includes floating loop structures residing within and between corresponding loop structures.

Further, FIG. 20B illustrates an exemplary tunable slow-wave transmission line 348 similar to the tunable slow-wave transmission line 338 in FIG. 20A. However, in addition to including the first and second floating loop structures 340(1), 340(2), the tunable slow-wave transmission line 348 also includes a middle floating loop structure 350 configured to tune the frequency of a transmitted signal. A portion 352 of the middle floating loop structure 350 resides within a space 354 between the first loop structure 80(1) and the second loop structure 80(2). Notably, the middle floating loop structure 350 is electrically isolated from the undulating signal path 78. The middle floating loop structure 350 is also electrically isolated from the second ground structure 90 by gaps illustrated as shaded regions adjacent to the second ground structure 90. Further, a series element 356 is included in the middle floating loop structure 350. In this embodiment, the series element 356 is a switch (also referred to herein as switch 356), such that the switch 356 may control whether a current flows through the middle floating loop structure 350, respectively. Activation of the switch 356 induces a magnetic field corresponding to the middle floating loop structure 350 similar to the induced magnetic field corresponding to the first floating loop structure 340(1) previously described in FIG. 20A. Thus, the induced magnetic field corresponding to the middle floating loop structure 350 may affect the frequency of the signal transmitted in the tunable slow-wave transmission line 348.

Those skilled in the art will recognize improvements and modifications to the embodiments of the present disclosure. All such improvements and modifications are considered within the scope of the concepts disclosed herein and the claims that follow.

What is claimed is:

1. A tunable slow-wave transmission line formed in a multi-layer substrate and comprising:
   an undulating signal path comprising at least two loop structures, each of the at least two loop structures comprising at least two via structures connected by at least one intra-loop trace;
   at least one inter-loop trace connecting the at least two loop structures;
   a first ground structure disposed along the undulating signal path;
   wherein a loop inductance is formed within each of the at least two loop structures; and
   a first floating loop structure comprising a series element and wherein:
      a portion of the first floating loop structure resides within a space of a first loop structure of the at least two loop structures; and
      the first floating loop structure is electrically isolated from the undulating signal path.

2. The tunable slow-wave transmission line of claim 1 further comprising a second floating loop structure comprising a series element and wherein:
   a portion of the second floating loop structure resides within a space of a second loop structure of the at least two loop structures; and
   the second floating loop structure is electrically isolated from the undulating signal path.

3. The tunable slow-wave transmission line of claim 2 wherein the series element of the second floating loop structure is a capacitor.

4. The tunable slow-wave transmission line of claim 3 wherein the capacitor is a variable capacitor.

5. The tunable slow-wave transmission line of claim 2 wherein the series element of the second floating loop structure is a switch.

6. The tunable slow-wave transmission line of claim 2 wherein the series element of the second floating loop structure is a transistor.

7. The tunable slow-wave transmission line of claim 2 further comprising a middle floating loop structure comprising a series element and wherein:
   a portion of the middle floating loop structure resides within a space between the first loop structure and the second loop structure of the at least two loop structures; and
   the middle floating loop structure is electrically isolated from the undulating signal path.

8. The tunable slow-wave transmission line of claim 1 further comprising a middle floating loop structure comprising a series element and wherein:
   a portion of the middle floating loop structure resides within a space between the first loop structure and a second loop structure of the at least two loop structures; and
   the middle floating loop structure is electrically isolated from the undulating signal path.

9. The tunable slow-wave transmission line of claim 8 wherein the series element of the middle floating loop structure is a capacitor.

10. The tunable slow-wave transmission line of claim 9 wherein the capacitor is a variable capacitor.

11. The tunable slow-wave transmission line of claim 8 wherein the series element of the middle floating loop structure is a switch.

12. The tunable slow-wave transmission line of claim 8 wherein the series element of the middle floating loop structure is a transistor.

13. The tunable slow-wave transmission line of claim 1 wherein the series element of the first floating loop structure is a capacitor.

14. The tunable slow-wave transmission line of claim 13 wherein the capacitor is a variable capacitor.

15. The tunable slow-wave transmission line of claim 1 wherein the series element of the first floating loop structure is a switch.

16. The tunable slow-wave transmission line of claim 1 wherein the series element of the first floating loop structure is a transistor.

* * * * *

UNITED STATES PATENT AND TRADEMARK OFFICE
CERTIFICATE OF CORRECTION

PATENT NO. : 9,847,565 B2  
APPLICATION NO. : 14/930937  
DATED : December 19, 2017  
INVENTOR(S) : Dirk Robert Walter Leipold et al.

Page 1 of 2

It is certified that error appears in the above-identified patent and that said Letters Patent is hereby corrected as shown below:

In the Specification

In Column 1, Line 39, replace "permittivity ($\in$)" with --permittivity ($\varepsilon$)--.

In Column 1, Line 46, replace "($\in_{low}$) material" with --($\varepsilon_{low}$) material--.

In Column 1, Line 49, replace "permittivity (Vf=1/$\sqrt{\in}$(r)). Thus, the $\in_{low}$" with --permittivity (Vf=1/$\sqrt{\varepsilon}$(r)). Thus, the $\varepsilon_{low}$--.

In Column 1, Line 60, replace "$\in_{low}$ material" with --$\varepsilon_{low}$ material--.

In Column 1, Line 67, replace "$\in_{high}$ material" with --$\varepsilon_{high}$ material--.

In Column 2, Line 2, replace "$\in_{high}$ material" with --$\varepsilon_{high}$ material--.

In Column 2, Line 4, replace "$\in_{high}$ material" with --$\varepsilon_{high}$ material--.

In Column 2, Line 6, replace "using a $\in_{low}$" with --using a $\varepsilon_{low}$--.

In Column 7, Line 13, replace "$\in$(r)) of the slow-wave" with --$\varepsilon$(r)) of the slow-wave--.

In Column 7, Line 14, replace "permittivity $\in$(r)" with --permittivity $\varepsilon$(r)--.

In Column 7, Line 15, replace "factor (Vf) (Vf=1/$\sqrt{\in}$(r))" with --factor (Vf) (Vf=1/$\sqrt{\varepsilon}$(r))--.

In Column 7, Line 25, replace "($\in_{low}$) material" with --($\varepsilon_{low}$) material--.

Signed and Sealed this  
Twenty-ninth Day of May, 2018

Andrei Iancu  
*Director of the United States Patent and Trademark Office*

CERTIFICATE OF CORRECTION (continued)
U.S. Pat. No. 9,847,565 B2

In Column 7, Line 28, replace "($\in_{high}$) material" with --($\varepsilon_{high}$) material--.

In Column 11, Line 67, replace "the 1-shaped" with --the I-shaped--.

In Column 12, Line 1, replace "the 1-shaped" with --the I-shaped--.

In Column 15, Line 67, replace "permittivity $\in(r)$" with --permittivity $\varepsilon(r)$--.

In Column 16, Line 2, replace "wherein $\in(r)=\in/\in(0)$, $\in(0)$" with --wherein $\varepsilon(r)=\varepsilon/\varepsilon(0)$, $\varepsilon(0)$--.

In Column 16, Line 3, replace "($\in(0)=8.85\times10E-12$ F/m), and c is the" with --($\varepsilon(0)=8.85\times10E-12$ F/m), and $\varepsilon$ is the--.

In Column 16, Line 4, replace "permittivity $\in(r)$" with --permittivity $\varepsilon(r)$--.

In Column 16, Line 6, replace "permittivity $\in(r)$" with --permittivity $\varepsilon(r)$--.

In Column 16, Line 33, replace "permittivity (Vf=$1/\sqrt{\in(r)}$)" with --permittivity (Vf=$1/\sqrt{\varepsilon(r)}$)--.